(12) United States Patent
Sugita et al.

(10) Patent No.: US 9,640,323 B2
(45) Date of Patent: May 2, 2017

(54) MULTILAYER CERAMIC CAPACITOR

(71) Applicant: Murata Manufacturing Co., Ltd., Nagaokakyo-shi, Kyoto-fu (JP)

(72) Inventors: Hiroaki Sugita, Nagaokakyo (JP); Shota Kitano, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 79 days.

(21) Appl. No.: 14/822,916

(22) Filed: Aug. 11, 2015

(65) Prior Publication Data
US 2016/0049254 A1 Feb. 18, 2016

(30) Foreign Application Priority Data

Aug. 13, 2014 (JP) .................. 2014-164842

(51) Int. Cl.
*H01G 4/30* (2006.01)
*H01G 4/12* (2006.01)
*H01G 4/232* (2006.01)

(52) U.S. Cl.
CPC ............. *H01G 4/30* (2013.01); *H01G 4/1209* (2013.01); *H01G 4/232* (2013.01)

(58) Field of Classification Search
CPC ......... H01G 4/30; H01G 4/1209; H01G 4/232
USPC ..................................................... 361/301.4
See application file for complete search history.

(56) References Cited

U.S. PATENT DOCUMENTS

| | | |
|---|---|---|
| 2008/0013252 A1 | 1/2008 | Nakano et al. |
| 2009/0009927 A1 | 1/2009 | Iguchi et al. |
| 2012/0152604 A1 | 6/2012 | Ahn et al. |
| 2012/0300361 A1 | 11/2012 | Togashi |
| 2013/0038979 A1 | 2/2013 | Togashi |
| 2013/0233606 A1 | 9/2013 | Fujii et al. |
| 2013/0319741 A1 | 12/2013 | Ahn et al. |
| 2014/0020942 A1 | 1/2014 | Cho et al. |
| 2014/0083755 A1 | 3/2014 | Lee et al. |
| 2014/0131082 A1 | 5/2014 | Ahn et al. |
| 2014/0151102 A1 | 6/2014 | Lee et al. |
| 2014/0153155 A1 | 6/2014 | Fujii et al. |

(Continued)

FOREIGN PATENT DOCUMENTS

| | | |
|---|---|---|
| JP | 06-215978 A | 8/1994 |
| JP | 07-045469 A | 2/1995 |
| JP | 2006-351712 A | 12/2006 |

(Continued)

OTHER PUBLICATIONS

Official Communication issued in corresponding Korean Patent Application No. 10-2015-0108539, mailed on Jun. 9, 2016.

*Primary Examiner* — Eric Thomas
*Assistant Examiner* — Michael P McFadden
(74) *Attorney, Agent, or Firm* — Keating & Bennett, LLP

(57) ABSTRACT

A multilayer body includes an inner layer portion having a dimension in a stacking direction greater than a dimension of the inner layer portion in a width direction, a second outer layer portion including an outer portion including a second principle surface and an inner portion disposed adjacent to both of the outer portion and the inner layer portion, a dimension of the outer portion in the stacking direction being greater than a dimension of the inner portion, and a composition ratio of Si relative to Ti in the outer portion is greater than that in the inner portion.

10 Claims, 17 Drawing Sheets

(56) References Cited

U.S. PATENT DOCUMENTS

2014/0166351 A1  6/2014 Lee et al.
2014/0177134 A1* 6/2014 Awata .................. H01G 4/1236
                                                    361/321.5

FOREIGN PATENT DOCUMENTS

| | | |
|---|---|---|
| JP | 2009-16547 A | 1/2009 |
| JP | 2012-248581 A | 12/2012 |
| JP | 2014-027085 A | 2/2014 |
| JP | 2014-033097 A | 2/2014 |
| KR | 10-1058697 B1 | 8/2011 |
| WO | 2006/098092 A1 | 9/2006 |

* cited by examiner

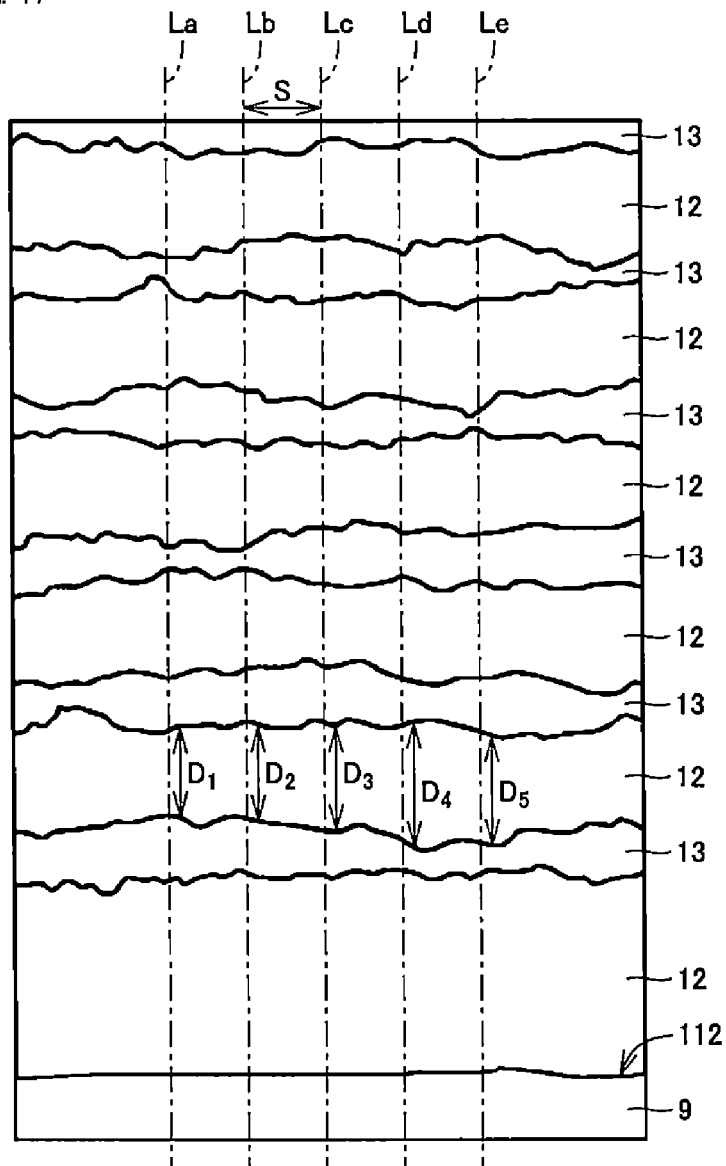

MULTILAYER CERAMIC CAPACITOR

BACKGROUND OF THE INVENTION

1. Field of the Invention

The present invention relates to multilayer ceramic capacitors, multilayer ceramic capacitor arrays, and multilayer ceramic capacitor mounted bodies.

2. Description of the Related Art

Japanese Unexamined Patent Application Publication No. 2012-248581 discloses a multilayer ceramic capacitor that suppresses the occurrence of cracks. In the multilayer ceramic capacitor described in Japanese Unexamined Patent Application Publication No. 2012-248581, a base body includes an inner electrode multilayer body (inner layer portion) in which a first inner electrode and a second internal electrode are stacked so as to face each other with a dielectric therebetween; and a first dielectric multilayer body (outer layer) and a second dielectric multilayer body (outer layer) that sandwich the inner electrode multilayer body (inner layer portion) from both sides thereof in a stacking direction. Further, the first dielectric multilayer body (outer layer) including a first base body principal surface is formed so as to be thicker than the second dielectric multilayer body (outer layer) including a second base body principal surface in the stacking direction.

SUMMARY OF THE INVENTION

Modes of how cracks occur include a mode in which an outer stress is applied to a dielectric layer of the multilayer ceramic capacitor and causes a crack to occur therein. The outer stress is produced when a substrate on which a multilayer ceramic capacitor is mounted is subjected to an external force.

The inventors of the present invention discovered another mode of the occurrence of cracks. In this mode, the inventors discovered that an inner stress is produced due to a difference in thermal contraction rates between the dielectric layer and the conductive layer at the time of firing of the multilayer ceramic capacitor, and this inner stress is applied to a boundary between the inner layer portion and the outer layer portion and causes a crack to occur (delamination).

In the multilayer ceramic capacitor described in Japanese Unexamined Patent Application Publication No. 2012-248581, the occurrence of cracks caused by the external stress is significantly reduced or prevented, however, no consideration is given with regard to suppression of the occurrence of cracks caused by the internal stress produced due to the difference in thermal contraction rates between the dielectric layer and the conductive layer.

Accordingly, preferred embodiments of the present invention provide a multilayer ceramic capacitor capable of significantly reducing or preventing cracks caused by internal stress produced due to a difference in thermal contraction rates between the dielectric layer and the conductive layer.

A multilayer ceramic capacitor according to a preferred embodiment of the present invention includes a multilayer body including a plurality of dielectric layers and a plurality of conductive layers, which are stacked therein in a stacking direction, and including a first principle surface and a second principle surface that are opposite to each other in the stacking direction, a first end surface and a second end surface that are opposite to each other in a length direction and connect the first principle surface and the second principle surface, and a first side surface and a second side surface that are opposite to each other in a width direction and connect the first principle surface and the second principle surface as well as the first end surface and the second end surface, and first and second outer electrodes provided on portions of a surface of the multilayer body and electrically connected to at least one of the plurality of conductive layers, wherein the multilayer body includes a first outer layer portion which includes a first of the plurality of dielectric layers closest to the first principle surface, a second outer layer portion which includes a second of the plurality of dielectric layers closest to the second principle surface, and an inner layer portion adjacent to both of the first outer layer portion and the second outer layer portion, the inner layer portion including a portion extending from a first of the plurality of conductive layers closest to the first principle surface to a second of the plurality of conductive layers closest to the second principle surface in the stacking direction, a dimension of the inner layer portion in the stacking direction is greater than a dimension of the inner layer portion in the width direction, the second outer layer portion includes an outer portion including the second principle surface, and an inner portion disposed adjacent to both of the outer portion and the inner layer portion, a dimension of the outer portion in the stacking direction is greater than a dimension of the inner portion, and a composition ratio of Si relative to Ti in the outer portion is greater than that in the inner portion.

In the present application, the term "a composition ratio of Si relative to Ti" indicates a value of Si mol/Ti mol, and the Si content can be recognized by element mapping, for example.

In a preferred embodiment of the present invention, the dimension of the inner layer portion in the stacking direction is greater than a dimension of the multilayer body in the width direction.

In a preferred embodiment of the present invention, a boundary region adjacent to the inner portion has a larger Si content compared to a central region of the outer portion in the stacking direction.

In a preferred embodiment of the present invention, the first and second outer electrodes are disposed on portions of the second principle surface of the multilayer body, and a surface region including the second principle surface in the outer portion has a larger Si content compared to that of a central region of the outer portion in the stacking direction.

In a preferred embodiment of the present invention, a composition ratio of a rare earth element relative to Ti of the dielectric layers in the inner layer portion is higher than that in the outer portion.

In the present application, the term "a composition ratio of rare earth element relative to Ti" indicates a value of rare earth mol/Ti mol.

In a preferred embodiment of the present invention, a composition ratio of Dy relative to Ti of the dielectric layers in the inner layer portion is higher than that in the outer portion.

In the present application, the term "composition ratio of Dy relative to Ti" indicates a value of Dy mol/Ti mol.

In a preferred embodiment of the present invention, each of a composition ratio of Mn relative to Ti of the dielectric layers in the inner layer portion, a composition ratio of Mn relative to Ti of the dielectric layers in the first outer layer portion, and a composition ratio of Mn relative to Ti of the dielectric layers in the inner portion, is higher than that in the outer portion.

In the present application, the term "a composition ratio of Mn to Ti" indicates a value of Mn mol/Ti mol.

In a preferred embodiment of the present invention, the composition ratio of Si relative to Ti in the outer portion is about 0.004 higher than that in the inner portion, the composition ratio of Si relative to Ti in the outer portion is not less than about 0.013 and not larger than about 0.03, a composition ratio of a rare earth element composition relative to Ti in the dielectric layers of the inner layer portion is not less than about 0.003, and a composition ratio of a rare earth element relative to Ti in the outer portion is less than about 0.003, each of a composition ratio of Mn relative to Ti in the dielectric layers of the inner layer portion, a composition ratio of Mn relative to Ti of the dielectric layers in the first outer layer portion, and a composition ratio of Mn relative to Ti of the dielectric layers in the inner portion is not less than about 0.0008, and a composition ratio of Mn relative to Ti in the outer portion is not more than about 0.0008.

According to another preferred embodiment of the present invention, a multilayer ceramic capacitor series includes a plurality of multilayer ceramic capacitors, each of the plurality of multilayer ceramic capacitors being the multilayer ceramic capacitor according to one of the preferred embodiments of the present invention described above, and a package including a carrier tape and a cover tape, the carrier tape including a plurality of cavities disposed apart from each other in which the plurality of multilayer ceramic capacitors are stored, the cover tape being attached to the carrier tape and covering the plurality of cavities, wherein the second principle surfaces of the plurality of multilayer ceramic capacitors face bottoms of the plurality of respective cavities.

According to a further preferred embodiment of the present invention, a multilayer ceramic capacitor mount body includes the multilayer ceramic capacitor according to one of the preferred embodiments of the present invention described above, a substrate on which the multilayer ceramic capacitor is mounted, wherein the second principle surface of the multilayer ceramic capacitor faces the substrate.

Various preferred embodiments of the present invention, and modifications and combinations thereof, significantly reduce or prevent the occurrence of cracks caused by the internal stress produced due to the difference in thermal contraction rates between the dielectric layer and the conductive layer.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 17 is a view illustrating an example of a magnified image of a cross section of a multilayer ceramic capacitor observed with a scanning electron microscope.

DETAILED DESCRIPTION OF THE PREFERRED EMBODIMENTS

Figure 1:
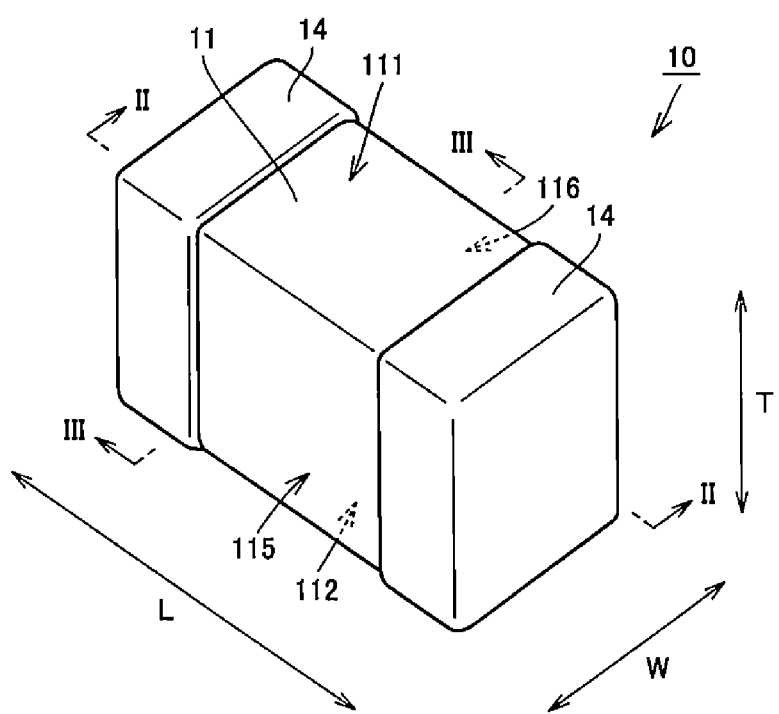
FIG. 1 is a perspective view illustrating an exterior of a multilayer ceramic capacitor according to preferred embodiment 1 of the present invention.

A multilayer ceramic capacitor, a multilayer ceramic capacitor array including the multilayer ceramic capacitor, and a multilayer ceramic capacitor mounted body according to respective preferred embodiments of the present invention are described below with reference to the drawings. In the description of preferred embodiments below, the same reference numerals are assigned to the same or corresponding portions in the drawings, and description thereof will not be repeated.

Preferred Embodiment 1

Figure 2:
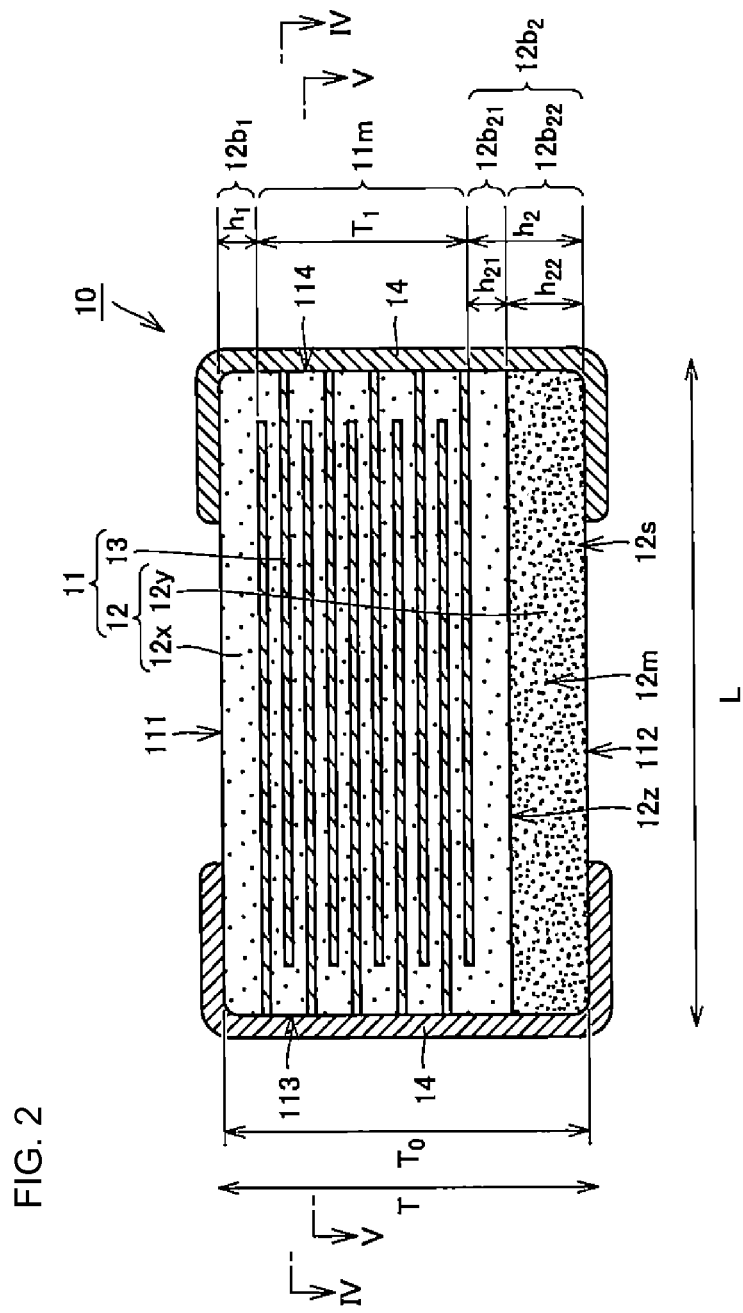
FIG. 2 is a cross sectional view of the multilayer ceramic capacitor of FIG. 1 viewed from a line II-II arrow direction.
Figure 3:
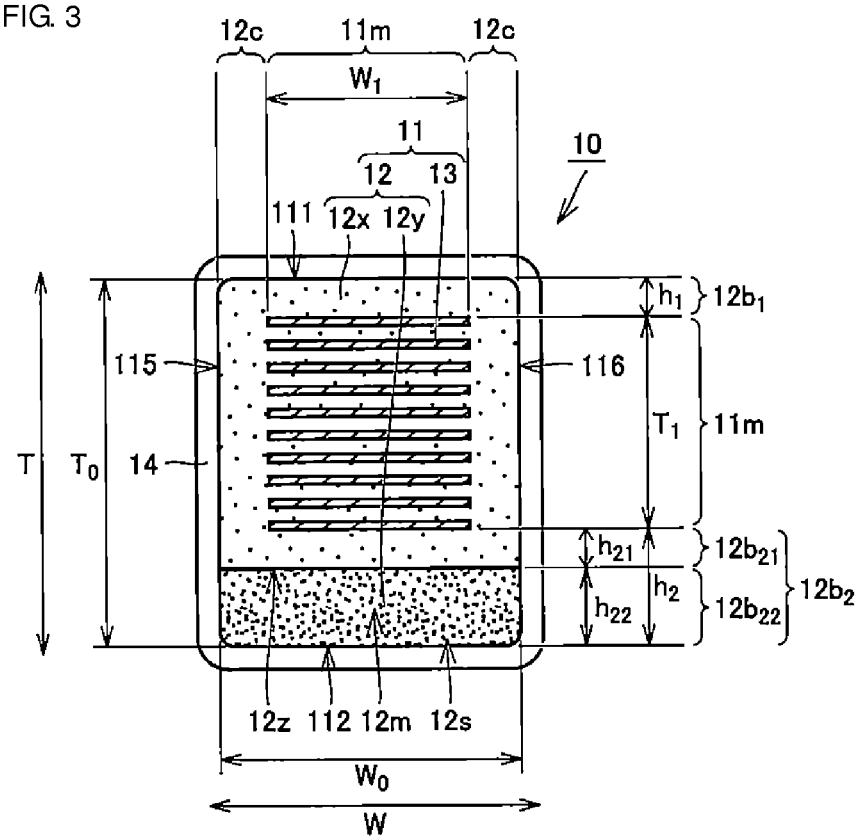
FIG. 3 is a cross sectional view of the multilayer ceramic capacitor of FIG. 1 viewed from a line III-III arrow direction.
Figure 4:
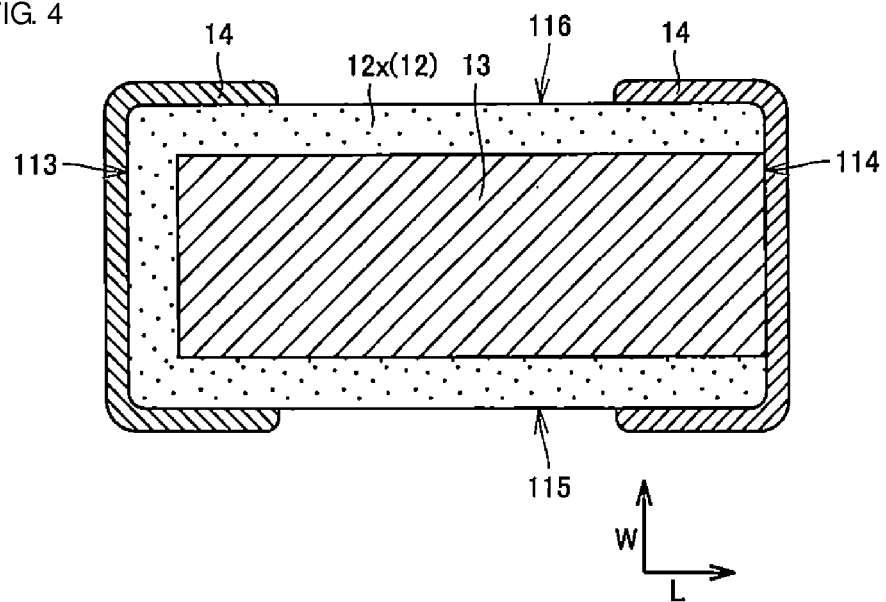
FIG. 4 is a cross sectional view of the multilayer ceramic capacitor of FIG. 2 viewed from a line IV-IV arrow direction.
Figure 5:
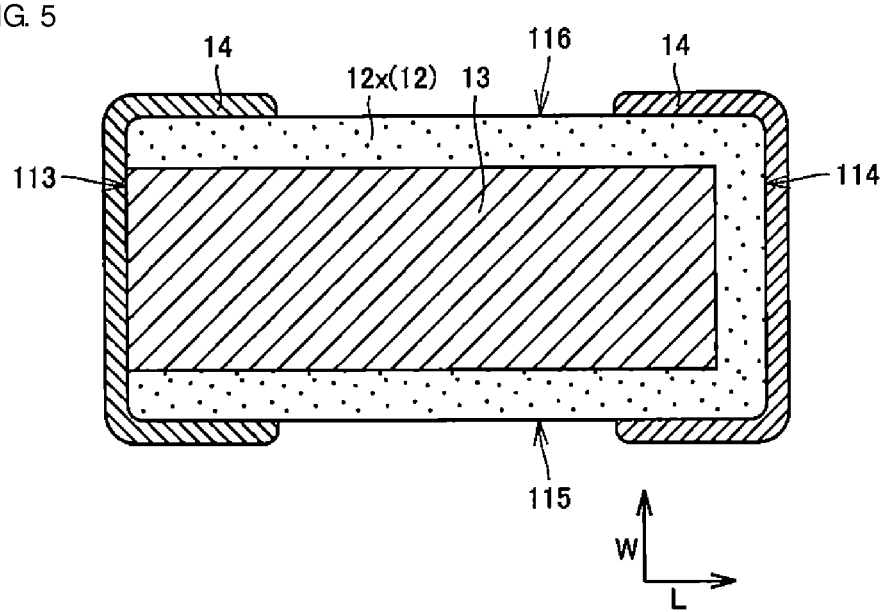
FIG. 5 is a cross sectional view of the multilayer ceramic capacitor of FIG. 2 viewed from a line V-V arrow direction.

FIG. 1 is a perspective view illustrating an exterior of a multilayer ceramic capacitor according to the preferred embodiment 1 of the present invention. FIG. 2 is a cross sectional view of the multilayer ceramic capacitor of FIG. 1 viewed from a line II-II arrow direction. FIG. 3 is a cross sectional view of the multilayer ceramic capacitor of FIG. 1 viewed from a line III-III arrow direction. FIG. 4 is a cross sectional view of the multilayer ceramic capacitor of FIG. 2 viewed from a line IV-IV arrow direction. FIG. 5 is a cross sectional view of the multilayer ceramic capacitor of FIG. 2 viewed from a line V-V arrow direction. In FIGS. 1 to 5, L denotes a lengthwise direction of a multilayer body which will be described below, W denotes a widthwise direction of the multilayer body, and T denotes a thickness direction of the multilayer body.

As illustrated in FIGS. 1 to 5, a multilayer ceramic capacitor 10 according to the preferred embodiment 1 of the present invention includes a multilayer body 11 and a pair of outer electrodes 14. The multilayer body 11 includes a plurality of dielectric layers 12 and a plurality of conductive layers 13, which are stacked on each other, and is provided with a first principle surface 111 and a second principle surface 112 that are arranged opposite to each other in a stacking direction. The pair of outer electrodes 14 is provided at portions of the surface of the multilayer body 11 and is electrically connected to all the conductive layers 13.

The stacking direction of the dielectric layers 12 and the conductive layers 13 is perpendicular or substantially perpendicular to the lengthwise direction L of the multilayer body 11 and the widthwise direction W of the multilayer body 11. In other words, the stacking direction of the dielectric layers and the conductive layers 13 is parallel or substantially parallel to the thickness direction T of the multilayer body 11.

The multilayer body 11 further includes a first end surface 113 and a second end surface 114 that connect the first principle surface 111 and the second principle surface 112 and are arranged at opposite sides of the multilayer body 11. The multilayer body 11 still further includes a first side surface 115 and a second side surface 116 that connect the first principle surface 111 and the second principle surface 112, connect the first end surface 113 and the second end surface 114, and are arranged at opposite sides of the multilayer body 11. A minimum distance between the first side surface 115 and the second side surface 116 is less than a minimum distance between the first end surface 113 and the second end surface 114. In other words, a measurement $W_0$ of the multilayer body 11 in the widthwise direction W is less than a dimension of the multilayer body 11 in the lengthwise direction L. Externally the multilayer body 11 preferably has a cuboid or substantially cuboid shape, for example. Alternatively, the corner portion or the ridge portion or both of the multilayer body 11 may be rounded.

The multilayer body 11 includes an inner layer portion $11m$, and a first outer layer portion $12b_1$ and a second outer layer portion $12b_2$ with the inner layer portion $11m$ located therebetween. The inner layer portion $11m$ includes, of the plurality of conductive layers 13, a conductive layer 13 arranged closest to the first principle surface 111 side to a conductive layer 13 arranged closest to the second principle surface 112 side in the stacking direction of the multilayer body 11.

The plurality of dielectric layers 12 includes a plurality of first dielectric layers $12x$ and a second dielectric layer $12y$, which preferably include ceramic green sheets containing different materials from each other, which will be described below.

The first outer layer portion $12b_1$ includes, of the plurality of dielectric layers 12, a first dielectric layer $12x$ arranged closest to the first principle surface 111 side. The second outer layer portion $12b_2$ includes an outer portion $12b_{22}$ and an inner portion $12b_{21}$. The outer portion $12b_{22}$ preferably includes the second dielectric layer $12y$, which is one of the plurality of dielectric layers 12, arranged closest to the second principle surface 112 side. The inner portion $12b_{21}$ preferably includes a first dielectric layer $12x$ arranged next to the outer portion $12b_{22}$ at the first principle surface 111 side. Here, the configuration of the first outer layer portion $12b_1$ is not limited to the foregoing one. Alternatively, the first outer layer portion $12b_1$ may include an outer portion and an inner portion wherein the outer portion preferably includes the second dielectric layer $12y$, which is one of the plurality of dielectric layers 12, arranged closest to the first principle surface 111 side, and the inner portion preferably includes a first dielectric layer $12x$ that is arranged next to the outer portion at the second principle surface 112 side.

In the inner layer portion $11m$, a partial set of the plurality of dielectric layers $12x$ and all the conductive layers 13 are stacked in such a way that the first dielectric layers $12x$ and the conductive layers 13 are stacked on top of each other in an alternating fashion. In other words, the inner layer portion $11m$ includes all the conductive layers 13. Each conductive layer preferably has a rectangular or substantially rectangular shape in planar view.

In the present preferred embodiment, all the conductive layers 13 are electrically connected to the pair of outer electrodes 14, but it is not limited thereto. In another preferred embodiment, at least a partial set of the plurality of conductive layers 13 may be electrically connected to the pair of outer electrodes 14. In other words, the plurality of conductive layers 13 may include a conductive layer 13 that is not electrically connected to the pair of outer electrodes 14.

The pair of outer electrodes 14 is provided at both sides of the multilayer body 11 in the lengthwise direction L. Specifically, one of the pair of outer electrodes 14 is provided at the first end surface 113 side of the multilayer body 11 in the lengthwise direction L, and the other outer electrode 14 is provided at the second end surface 114 side of the multilayer body 11 in the lengthwise direction L. In the present preferred embodiment, one of the pair of outer electrodes 14 is preferably arranged so as to extend from the first end surface 113 to the first principle surface 111, the second principle surface 112, the first side surface 115, and the second side surface 116. The other outer electrode 14 is preferably arranged so as to extend from the second end surface 114 to the first principle surface 111, the second principle surface 112, the first side surface 115, and the second side surface 116. The arrangement of the pair of outer electrodes 14 is, however, not limited to the foregoing one. A different arrangement may be used as long as the pair of outer electrodes 14 is disposed on portions of the surface of the multilayer body 11, has electrical connections with at least some of the plurality of conductive layers 13, and makes it possible the multilayer ceramic capacitor 10 to be mounted.

One of the pair of outer electrodes 14 is connected to a partial set of the plurality of conductive layers 13 at the first end surface 113. The other outer electrode 14 is connected to the remaining set of the plurality of conductive layers 13 at the second end surface 114. The partial set of the conductive layers 13 and the remaining set of the conductive layers 13 are stacked in alternating fashion so as to face each other in the inner layer portion $11m$ with the first dielectric layer $12x$ therebetween.

As illustrated in FIG. 3, a thickness $T_1$ of the inner layer portion $11m$ in the stacking direction of the multilayer body 11 is larger than a width measurement $W_1$ of the inner layer portion $11m$, in which the plurality of conductive layers 13 are present, in the widthwise direction W of the multilayer body 11, which is a direction connecting the first side surface 115 and the second side surface 116 with a minimum distance. The thickness $T_1$ of the inner layer portion $11m$ in the stacking direction of the multilayer body 11 preferably is larger than the width measurement $W_0$ of the multilayer body 11 in the direction connecting the first side surface 115 and the second side surface 116 with the minimum distance.

Preferably, a thickness $h_{22}$ of the outer portion $12b_{22}$ is equal to or larger than a thickness $h_{21}$ of the inner portion $12b_{21}$. Preferably, the thickness $h_{22}$ of the outer portion $12b_{22}$ is about 30 μm or more, for example, as will be described below. Preferably, the thickness $h_{21}$ of the inner portion $12b_{21}$ is about 20 μm or more, for example, as will be described below.

In the present preferred embodiment, the second outer layer portion $12b_2$ is thicker than the first outer layer portion $12b_1$. In other words, a thickness $h_2$ of the second outer layer portion $12b_2$ is larger than a thickness $h_1$ of the first outer layer portion $12b_1$. The inner portion $12b_{21}$ is thicker than the first outer layer portion $12b_1$. In other words, the thickness $h_{21}$ of the inner portion $12b_{21}$ is larger than the thickness $h_1$ of the first outer layer portion $12b_1$. Alternatively, the thickness $h_{21}$ of the inner portion $12b_{21}$ may be equal to or less than the thickness $h_1$ of the first outer layer portion $12b_1$, for example.

A thickness $T_0$ of the multilayer body 11 in the stacking direction of the multilayer body 11 preferably is equal or substantially equal to a sum of the thickness $T_1$ of the inner layer portion $11m$, the thickness $h_1$ of the first outer layer portion $12b_1$, and the thickness $h_2$ of the second outer layer portion $12b_2$.

Preferably, in the widthwise direction of the multilayer body 11, a maximum measurement of side gaps $12c$, which are gaps between the inner layer portion $11m$ and respective ones of the first side surface 115 and the second side surface 116, is larger than the thickness $h_1$ of the first outer layer portion $12b_1$, as will be described below. More preferably, an average measurement $((W_0-W_1)/2)$ of the side gaps $12c$ is larger than the thickness $h_1$ of the first outer layer portion $12b_1$. Still more preferably, the maximum measurement or the average measurement $((W_0-W_1)/2)$ of the side gaps $12c$ is larger than about 30 μm and less than about 90 μm, for example Further, the maximum measurement of the side gap $12c$ is preferably larger than the thickness $h_{21}$ of the inner portion $12b_{21}$.

Next, each element of the multilayer ceramic capacitor 10 is described in detail.

A metal such as Ni, Cu, Ag, Pd, Au, or the like, or an alloy including at least one of the foregoing metals such as, for example, an alloy of Ag and Pd or the like may be used as a material for forming each layer of the plurality of conductive layers 13. Preferably, the thicknesses of each layer of the plurality of conductive layers 13 is not less than about 0.3 μm and not more that about 2.0 μm after firing, for example.

Each one of the pair of outer electrodes 14 preferably includes a base layer preferably arranged so as to cover one of two end portions of the multilayer body 11 and a plated layer provided so as to cover this base layer. As a material for forming the base layer, a metal such as Ni, Cu, Ag, Pd, Au, or the like, or an alloy including at least one of the foregoing metals such as, for example, an alloy of Ag and Pd or the like may be used. Preferably, the thickness of the base layer is not less than about 10.0 μm and not more than about 50.0 μm, for example.

The base layer may be formed by using a method in which electrically conductive paste is baked after being applied on both end portions of the multilayer body 11 that has been subjected to firing or a method in which electrically conductive paste applied on both end portions of the multilayer body 11 before firing is baked together with the conductive layers 13. Alternatively, the base layer may be formed by using a method in which both end portions of the multilayer body 11 are plated or a method in which electrically conductive resin including thermoset resin is cured after being applied on both end portions of the multilayer body 11.

In the case that the base layer is formed from the electrically conductive resin, a load applied to the multilayer body 11 due to an external stress, which is produced when a component-receiving body on which the multilayer ceramic capacitor 10 is mounted is bent by an external force, may be reduced, and the occurrence of cracks in the multilayer body 11 is significantly reduced or prevented. Thus, making the second outer layer portion $12b_2$ thicker and forming the pair of outer electrodes 14 from the electrically conductive resin achieve further reduction or prevention of the occurrence of cracks in the multilayer body 11.

As a material for forming the plated layer, a metal such as Sn, Ni, Cu, Ag, Pd, Au, or the like, or an alloy including at least one of the foregoing metals such as, for example, an alloy of Ag and Pd or the like may be used.

The plated layer may include a plurality of layers, for example. In this case, it is preferable that the plated layer has a double layer structure in which a Sn plated layer is provided on a Ni plated layer. The Ni plated layer defines and serves as a solder barrier layer. The Sn plated layer has excellent solderablity. Preferably, the thickness of the plated layer at each layer is not less than about 1.0 μm and not more than about 10.0 μm, for example.

Each layer of the plurality of dielectric layers 12 preferably includes, as a primary component, a perovskite type compound that is represented as $ABO_3$ where A contains Ba, B contains Ti, and O is oxygen. In other words, each layer of the second dielectric layer $12y$ and the plurality of the first dielectric layers $12x$ preferably includes $BaTiO_3$, barium titanate, as the primary component.

Further, each layer of the plurality of dielectric layers 12 preferably includes Si as an accessory component. Si is contained as the accessory component by adding glass or a Si compound such as $SiO_2$ or the like to the primary component, namely, the perovskite type compound represented as $ABO_3$. In addition, a Mn compound, a Mg compound, a Co compound, a Ni compound, a rare earth compound or the like may be added to the primary component, namely, the perovskite type compound represented as $ABO_3$.

The materials of the second dielectric layer $12y$ of the outer portion $12b_{22}$ have a higher Si composition ratio relative to Ti, compared to the materials of each one of a partial set of the first dielectric layers $12x$ included in the inner layer portion $11m$, the first dielectric layer $12x$ of the first outer layer portion $12b_1$, and the first dielectric layer $12x$ of the inner portion $12b_{21}$. The Si composition ratio as well as other constituent's composition ratios may be expressed as the molar ratio. In the following description, the composition ratio is expressed as the molar ratio. The molar ratio of Si relative to Ti at each layer of the plurality of dielectric layers 12 may be measured by using a wavelength-dispersive X-ray spectrometer (WDX).

Preferably, the molar ratio of Si relative to Ti in the materials of the second dielectric layer $12y$ of the outer portion $12b_{22}$ is not less than about 0.013 and not larger than about 0.03, for example. In the case where the molar ratio of Si relative to Ti in the materials of the second dielectric layer $12y$ of the outer portion $12b_{22}$ is not less than about 0.013 and not larger than about 0.03, the reliability of the outer portion $12b_{22}$ may become lower.

The molar ratio of Si relative to Ti in the materials of the second dielectric layer $12y$ of the outer portion $12b_{22}$ is higher preferably by about 0.004 or more, and more preferably about 0.008 or more, for example, compared to the molar ratio of Si relative to Ti in the materials of the first dielectric layer $12x$ forming the inner portion $12b_{21}$.

A boundary portion $12z$ of the outer portion $12b_{22}$ with the inner portion $12b_{21}$ has a larger Si content compared to a middle portion $12m$ of the outer portion $12b_{22}$. Further, a top layer portion $12s$ of the outer portion $12b_{22}$ on the second principle surface 112 side has a larger Si content compared to the middle portion $12m$ of the outer portion $12b_{22}$. The boundary portion $12z$ and the top layer portion $12s$ having larger Si content in the outer portion $12b_{22}$ may each be identified from element mapping performed with a field emission wavelength-dispersive X-ray spectrometer (FE-WDX).

Next, a non-limiting example of a fabrication method of the multilayer ceramic capacitor 10 according to the present preferred embodiment is described.

Figure 6:
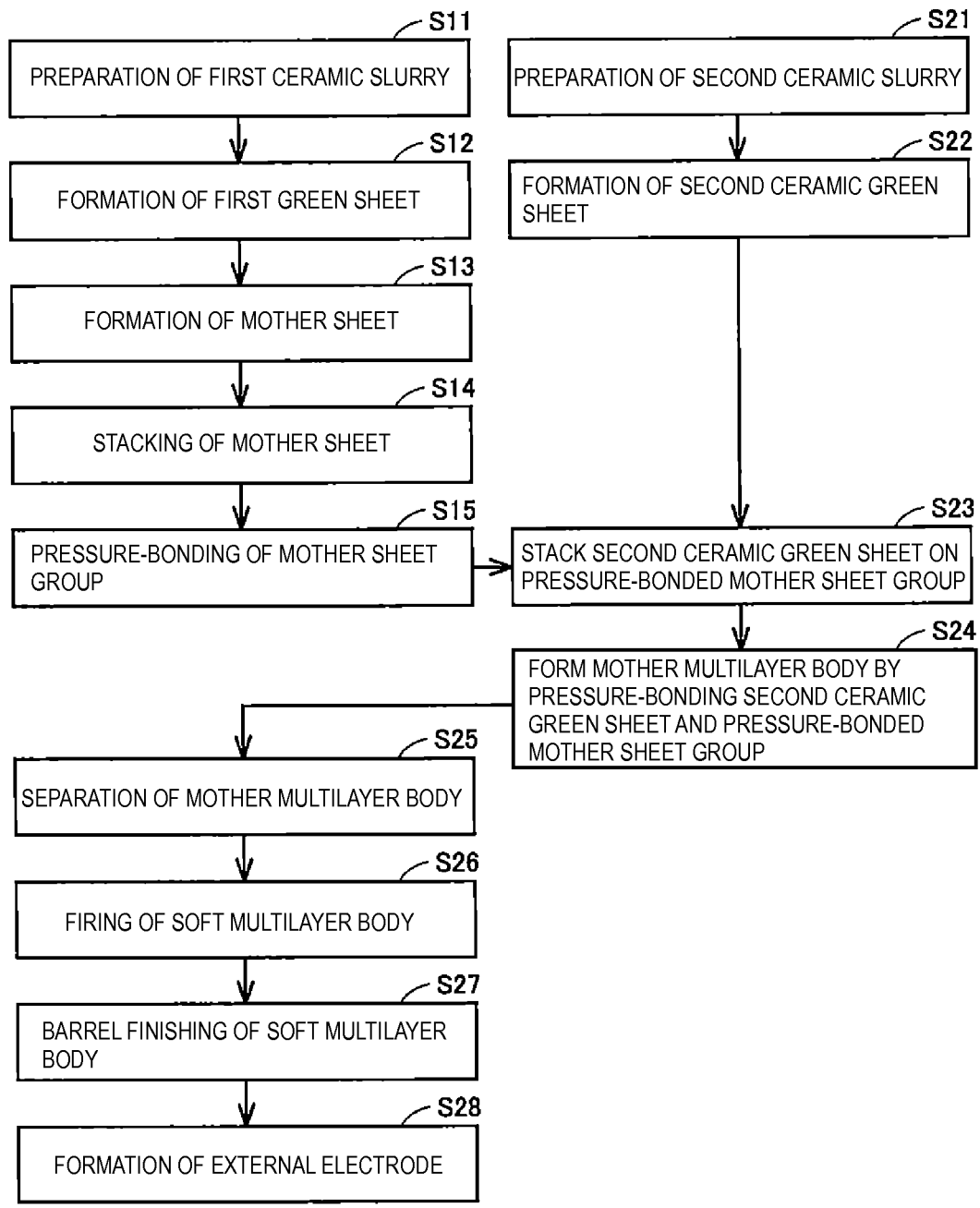
FIG. 6 is a flowchart illustrating a fabrication method of multilayer ceramic capacitor according to the preferred embodiment 1 of the present invention.

FIG. 6 is a flowchart illustrating a non-limiting example of a fabrication method of multilayer ceramic capacitor according to the preferred embodiment 1 of the present invention. The fabrication method of multilayer ceramic capacitor described below is a method in which the multilayer ceramic capacitors 10 are mass-produced simultaneously. In this method, a mother multilayer body is fabricated by performing batch processing up to a midway stage of the fabrication process, subsequently the mother multilayer body is cut into individual pieces, and then soft multilayer bodies obtained after the cutting are subjected to another processing to obtain a plurality of the multilayer ceramic capacitors 10.

As illustrated in FIG. 6, when fabricating the multilayer ceramic capacitor 10, a first ceramic slurry is prepared first (step S11). Specifically, ceramic powder, binder, solvent, and the like are mixed at a predetermined mixture ratio to form the first ceramic slurry.

Next, a first ceramic green sheet is formed (step S12). Specifically, the first ceramic green sheet is produced by forming the first ceramic slurry into a sheet shape on a carrier film by using a die coater, a gravure coater, a microgravure coater, or the like.

Next, a mother sheet is formed (step S13). Specifically, the mother sheet in which a predetermined electrically conductive pattern is provided on the first ceramic green sheet is formed by printing an electrically conductive paste on the first ceramic green sheet so as to form a predetermined pattern by using a screen printing method or a gravure printing method or the like.

Figure 7:
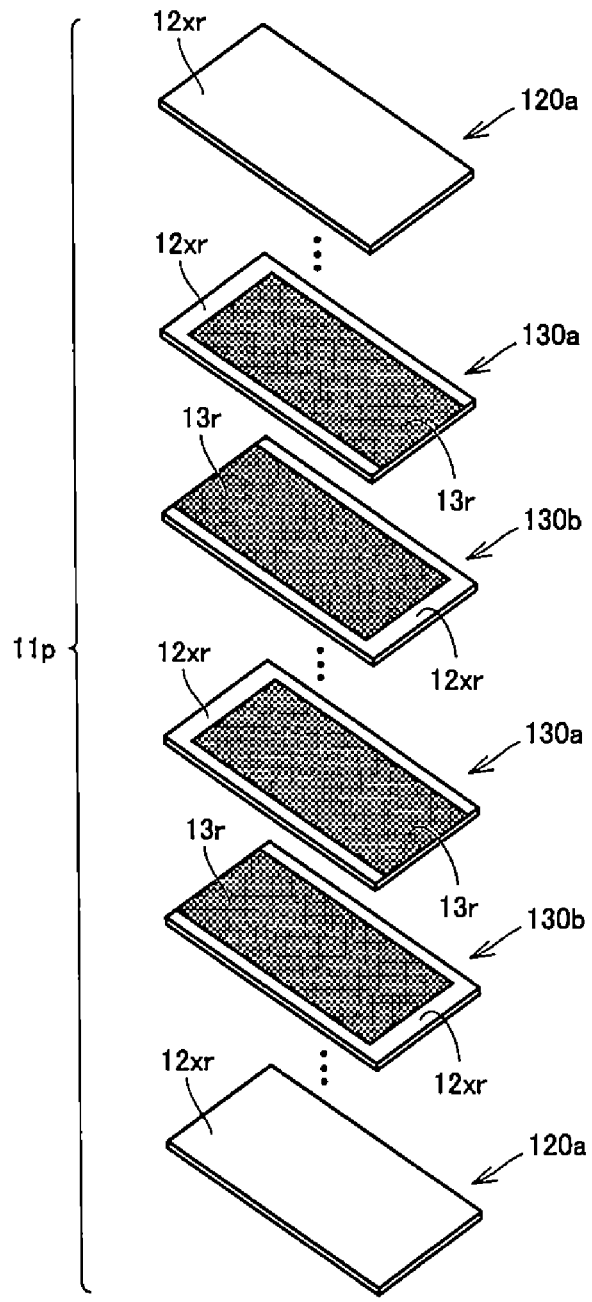
FIG. 7 is an exploded perspective view illustrating a multilayer structure of a sheet group unit that forms a partial multilayer body before formation of an outer portion of a multilayer ceramic capacitor according to the preferred embodiment 1 of the present invention.

The mother sheet to be manufactured is now described. FIG. 7 is an exploded perspective view illustrating a multilayer structure of a sheet group unit that forms a partial multilayer body before formation of an outer portion of a multilayer ceramic capacitor according to the preferred embodiment 1 of the present invention.

As illustrated in FIG. 7, a partial multilayer body $11p$ is fabricated by using as a constituent material a sheet group unit including a plurality of unit sheets $120a$, $130a$, and $130b$, whose structures are different from each other. More specifically, the partial multilayer body $11p$ is fabricated by stacking these plural unit sheets $120a$, $130a$, and $130b$ whose structures are different from each other in a predetermined order and then subjecting them to pressure-bonding and firing.

The unit sheet $120a$ preferably includes only a ceramic base material $12xr$ and has no electrically conductive pattern is formed on its top surface. The unit sheet $120a$ becomes a portion that forms the first dielectric layer $12x$ of the inner portion $12b_{21}$ or the first outer layer portion $12b_1$ after firing.

The unit sheets $130a$ and $130b$ are each formed in such a way that an electrically conductive pattern $13r$ having a predetermined shape is formed on the top surface of the ceramic base material $12xr$. The electrically conductive patterns $13r$ of the unit sheets $130a$ and $130b$ become portions that form the conductive layers 13 of the inner layer portion $11m$ after firing. Further, the ceramic base material $12xr$ of the unit sheets $130a$ and $130b$ become portions that form the first dielectric layers $12x$ of the inner layer portion $11m$ after firing.

The mother sheet has a layout in which a plurality of unit sheets having the same or substantially the same shape is arranged to form a planar array. Here, each unit sheet forms a unit block therein and corresponds to each one of the unit sheets $130a$ and $130b$ illustrated in FIG. 7.

Here, the unit sheet $130a$ and the unit sheet $130b$ preferably have the same or substantially the same shape. Thus, mother sheets having the same or substantially the same electrically conductive pattern may be used as the mother sheets including the unit sheets $130a$ and the unit sheets $130b$. The multilayer structure of the unit sheets $130a$ and $130b$ illustrated in FIG. 7 may be obtained by stacking the mother sheets having the same or substantially the same electrically conductive pattern while displacing each mother sheet by the amount of a half pitch during a stacking process of the mother sheets, which will be described below.

In addition to the mother sheets having the electrically conductive pattern $13r$, the first ceramic green sheets that are fabricated without going through the step S13 are also prepared as the mother sheets.

Next, the mother sheets are stacked (step S14). Specifically, stacking a plurality of the mother sheets according to a predetermined rule allows the unit blocks to be arranged in such a way that each unit block has the multilayer structure illustrated in FIG. 7 in the stacking direction within a mother sheet group after stacking.

Figure 8:
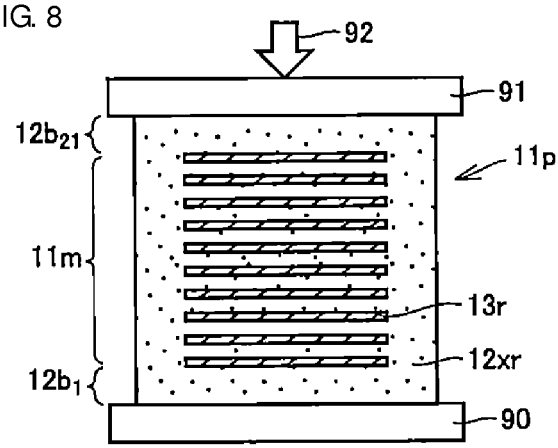
FIG. 8 is a cross sectional view illustrating a state where a mother sheet group is being pressure-bonded.

Next, the mother sheet group is pressure-bonded (step S15). FIG. 8 is a cross sectional view illustrating a state where the mother sheet group is being pressure-bonded. FIG. 8 illustrates only a portion that corresponds to one of partial multilayer bodies $11p$. As illustrated in FIG. 8, in the present preferred embodiment, a plurality of the mother sheets forming the first outer layer portion $12b_1$, a plurality of the mother sheets forming the inner layer portion $11m$, and a plurality of the mother sheets forming the inner portion $12b_{21}$ are stacked in this order to form the mother sheet group.

The mother sheet group placed on a base 90 is being compressed and pressure-bonded by pressing a die plate 91 from the side of the mother sheets that form the inner portion $12b_{21}$ in the stacking direction of the mother sheet group as denoted by an arrow 92.

Next, a second ceramic slurry is prepared (step S21). Specifically, ceramic power, binder, solvent, and the like are mixed at a predetermined mixture ratio to form the second ceramic slurry. Compared to the first ceramic slurry, more Si is added to the second ceramic slurry.

Next, a second ceramic green sheet is formed (step S22). Specifically, the second ceramic green sheet is produced by forming the second ceramic slurry into a sheet shape on a carrier film by using a die coater, a gravure coater, a microgravure coater, or the like.

Next, a plurality of the second ceramic green sheets is stacked on the mother sheet group that is pressure-bonded at step S15 (step S23). Specifically, a plurality of the second ceramic green sheets is stacked on the mother sheets forming the inner portion $12b_{21}$. The second ceramic green sheet preferably includes only a ceramic base material $12yr$ that forms the second dielectric layer $12y$ of the outer portion $12b_{22}$. Alternatively, instead of stacking the plurality of the second ceramic green sheets including only the ceramic base material $12yr$, a paste containing the second ceramic slurry may be applied over the mother sheet forming the inner portion $12b_{21}$.

Figure 9:
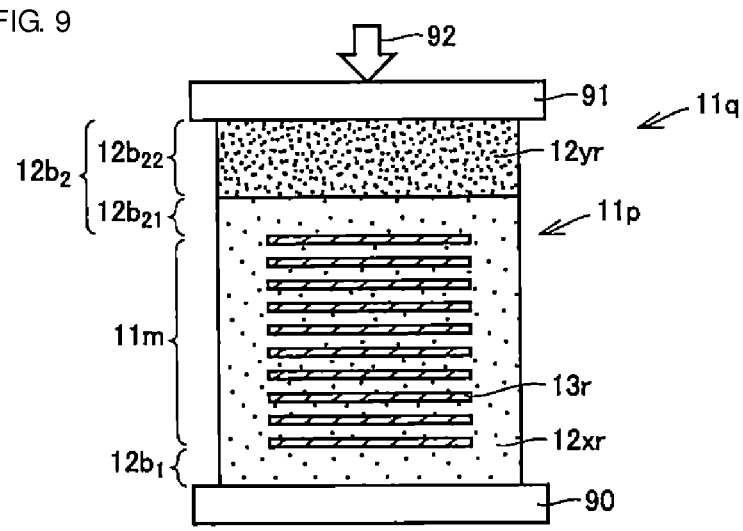
FIG. 9 is a cross sectional view illustrating a state where a mother sheet group pressured-bonded at step S15 and a plurality of second ceramic green sheets are being pressure-bonded.

Next, the mother sheet group that is pressure-bonded at step S15 and the plurality of the second ceramic green sheets are pressure-bonded (step S24). FIG. 9 is a cross sectional view illustrating a state where the mother sheet group pressured-bonded at step S15 and the plurality of the second ceramic green sheets are being pressure-bonded. FIG. 9 illustrates only a portion that corresponds to a one of soft multilayer bodies $11q$. As illustrated in FIG. 9, the mother sheet group that is pressure-bonded at step S15 and the plurality of the second ceramic green sheets are being compressed and pressure-bonded by pressing down the die plate 91 from the side of the mother sheets of the outer portion $12b_{22}$ along the stacking direction of the mother sheet group as denoted by the arrow 92. This completes the fabrication of the mother multilayer body.

Next, the mother multilayer body is cut (step S25). Specifically, the mother multilayer body is cut by shearing or dicing to separate in columns and rows, thus cutting into soft multilayer bodies $11q$.

Next, firing of the soft multilayer bodies $11q$ is performed (step S26). Specifically, the soft multilayer bodies $11q$ that are cut out are heated up to a predetermined temperature to perform firing of ceramic dielectric materials and an electrically conductive material. The firing temperature may be set in response to types of the ceramic dielectric materials and the electrically conductive material. For example, the firing temperature may be set in a range from about 900 degrees C. to about 1300 degrees C. inclusive.

Next, barrel finishing of the soft multilayer bodies $11q$ is performed (step S27). Specifically, the soft multilayer bodies $11q$ after firing are sealed in a small box called a barrel with a media ball having a higher hardness compared to ceramic materials, and this barrel is being tumbled to polish the soft multilayer bodies $11q$. This makes it possible to provide curved roundness at the outer surfaces (particularly at corner portions and ridge portions) of the soft multilayer bodies $11q$, and completes the formation of the multilayer body 11.

Next, the outer electrodes are formed (step S28). Specifically, a metal film is formed by painting an electrically conductive paste at an end portion of a portion of the multilayer body 11, which includes the first end surface 113, and at an end portion of another portion of the multilayer body 11, which includes the second end surface 114. Further, after these metal films are subjected to firing, the metal films are subjected to Ni plating and Sn plating in sequence. This completes the formation of a pair of outer electrodes 14 on the outer surface of the multilayer body 11.

A series of the foregoing steps makes possible the fabrication of the multilayer ceramic capacitor 10 having the structure illustrated in FIGS. 1 to 5.

In the multilayer ceramic capacitor 10 according to the present preferred embodiment, the materials of the second dielectric layer $12y$ of the outer portion $12b_{22}$ preferably have a higher molar ratio of Si relative to Ti, compared to the materials of each one of the partial set of the first dielectric layers $12x$ included in the inner layer portion $11m$ and the first dielectric layer $12x$ of the inner portion $12b_{21}$. In other words, the outer portion $12b_{22}$ includes more Si than the inner portion $12b_{21}$. The dielectric layer having a larger Si content has a higher thermal contraction rate at the time of firing. Thus, at the time of firing, the thermal contraction rate of the outer portion $12b_{22}$ is larger than that of the inner portion $12b_{21}$. As a result, the thermal contraction rate of the outer portion $12b_{22}$ approaches the thermal contraction rate of the conductive layer 13 in the inner layer portion $11m$.

Accordingly, in the multilayer ceramic capacitor 10, the internal stress is alleviated that is caused by a difference in thermal contraction ratio between the conductive layer and the dielectric layer at the time of firing and that is applied to the boundary between the inner layer portion $11m$ and the second outer layer portion $12b_2$. This significantly reduces or prevents the occurrence of cracks (delamination) at the boundary between the inner layer portion $11m$ and the second outer layer portion $12b_2$.

In the case where the molar ratio of Si relative to Ti in the materials of the second dielectric layer $12y$ of the outer portion $12b_{22}$ preferably is higher by about 0.004 or more, compared to that of the first dielectric layer $12x$ of the inner portion $12b_{21}$, the occurrence of cracks (delamination) is effectively reduced or prevented at the boundary between the inner layer portion $11m$ and the second outer layer portion $12b_2$. Further, in the case where this molar ratio preferably is higher by about 0.008 or more, the occurrence of cracks (delamination) is more effectively reduced or prevented at the boundary between the inner layer portion $11m$ and the second outer layer portion $12b_2$.

When the thickness of the outer portion $12b_{22}$ is equal to or larger than that of the inner portion $12b_{21}$ as described in the above, the effects of the stress alleviation caused by the thermal contraction of the outer portion $12b_{22}$ may reach the boundary between the inner layer portion $11m$ and the second outer layer portion $12b_2$ more easily.

When the thickness $h_{22}$ of the outer portion $12b_{22}$ is about 30 µm or more, a contraction force that is equal to or larger than a required value may be secured. The contraction force acts on the inner portion $12b_{21}$ due to the thermal contraction of the outer portion $12b_{22}$.

When the thickness $h_{21}$ of the inner portion $12b_{21}$ is about 20 µm or more, dispersion of Si contained in the outer portion $12b_{22}$ into the inner layer portion $11m$ is significantly reduced or prevented. When the Si content at the inner layer portion $11m$ becomes too large, grain growth of ceramic particles advances too far at the time of firing in the first dielectric layer $12x$ included in the inner layer portion $11m$, and voltage endurance of the first dielectric layer $12x$ decreases. As a result, the inner layer portion $11m$ becomes prone to short circuit. Thus, in the case where the thickness $h_{21}$ of the inner portion $12b_{21}$ is about 20 µm or more, the voltage endurance of the first dielectric layer $12x$ included in the inner layer portion $11m$ is maintained, and the occurrence of short circuit is significantly reduced or prevented.

As described above, the thickness $h_{21}$ of the inner portion $12b_{21}$ is larger than the thickness $h_1$ of the first outer layer portion $12b_1$. As will be described below, the boundary portion $12z$ of the outer portion $12b_{22}$ with the inner portion $12b_{21}$ improves a sticking force between the outer portion $12b_{22}$ and the inner portion $12b_{21}$. Therefore, even if the inner portion $12b_{21}$ is made somewhat thicker, the occurrence of cracks (delamination) is significantly reduced or prevented at the boundary between the outer portion $12b_{22}$ and the inner portion $12b_{21}$. Accordingly, the contraction force due to the thermal contraction of the outer portion $12b_{22}$ is allowed to act on the inner portion $12b_{21}$. This makes it possible to alleviate the internal stress applied to the boundary between the inner layer portion $11m$ and the inner portion $12b_{21}$ due to the difference in thermal contraction ratio between the conductive layer and the dielectric layer at the time of firing, and significantly reduce or prevent the occurrence of cracks (delamination) at the boundary between the inner layer portion $11m$ and the second outer layer portion $12b_2$.

As described above, the maximum measurement of the side gap $12c$ is preferably larger than the thickness $h_1$ of the first outer layer portion $12b_1$. In the case where the first outer layer portion $12b_1$ is made thinner, the internal stress, which acts on the boundary between the inner layer portion $11m$ and the first outer layer portion $12b_1$ due to the difference in thermal contraction ratio between the conductive layer and the dielectric layer at the time of firing, is alleviated. This makes it possible to significantly reduce or prevent the occurrence of cracks (delamination) at the boundary between the inner layer portion $11m$ and the first outer layer portion $12b_1$. In the case where the thickness $h_{21}$ of the inner portion $12b_{21}$ is about 20 μm or more, the dispersion of Si contained in the outer portion $12b_{22}$ into the inner layer portion $11m$ is significantly reduced or prevented. In the case where the Si content at the inner layer portion $11m$ becomes too large, the grain growth of ceramic particles advances too far at the time of firing in the first dielectric layer $12x$ included in the inner layer portion $11m$, and the voltage endurance of the first dielectric layer $12x$ decreases. As a result, the inner layer portion $11m$ becomes prone to short circuits. Thus, in the case where the thickness $h_{21}$ of the inner portion $12b_{21}$ is about 20 μm or more, the voltage endurance of the first dielectric layer $12x$ included in the inner layer portion $11m$ preferably is maintained, and the occurrence of short circuit is significantly reduced or prevented.

On the other hand, in the case where the maximum measurement of the side gap $12c$ is made larger, it becomes easier to apply load pressure to a plurality of the first dielectric layers $12x$ present at the side gaps $12c$ at the time of pressure bonding the mother sheet group. This improves adhesiveness among the first dielectric layers $12x$ present at the side gaps $12c$. As a result, the occurrence of cracks (delamination) is significantly reduced or prevented at the first dielectric layers $12x$ present at the side gaps $12c$.

As described above, the average measurement $((W_0-W_1)/2)$ of the side gaps $12c$ is more preferably larger than the thickness $h_1$ of the first outer layer portion $12b_1$. The average measurement $((W_0-W_1)/2)$ of the side gaps $12c$ corresponds to one half of a sum of adjacent side gaps $12c$ that belong to two multilayer bodies lying next to each other when the mother multilayer body is cut into individual multilayer bodies. Thus, in the case where the average measurement $((W_0-W_1)/2)$ of the side gaps $12c$ is made larger than the thickness $h_1$ of the first outer layer portion $12b_1$, it becomes easier to apply load pressure to a plurality of the first dielectric layers $12x$ present at the side gaps $12c$ at the time of pressure bonding the mother sheet group. This improves the adhesiveness among the first dielectric layers $12x$ present at the side gaps $12c$. As a result, the occurrence of cracks (delamination) is significantly reduced or prevented at the first dielectric layers $12x$ present at the side gaps $12c$. In other words, both the suppression effects against the occurrence of short circuit in the inner layer portion $11m$ and the occurrence of cracks (delamination) are achieved in a more stable manner even in the case where the dimension of the side gap $12c$ at the first side surface $115$ side differs from the dimension of the side gap $12c$ at the second side surface $116$ side.

As described above, the maximum measurement of the side gaps $12c$ is preferably larger than the thickness $h_{21}$ of the inner portion $12b_{21}$. In the case where the inner portion $12b_{21}$ is made thinner, it becomes easier to allow the contraction force due to the thermal contraction of the outer portion $12b_{22}$ to act on the inner portion $12b_{21}$. This makes it possible to alleviate the internal stress applied to the boundary between the inner layer portion $11m$ and the inner portion $12b_{21}$ due to the difference in thermal contraction ratio between the conductive layer and the dielectric layer at the time of firing, and significantly reduce or prevent the occurrence of cracks (delamination) at the boundary between the inner layer portion $11m$ and the second outer layer portion $12b_2$.

As described above, the maximum measurement or the average measurement $((W_0-W_1)/2)$ of the side gaps $12c$ is still more preferably larger than about 30 μm and less than about 90 μm, for example. When the maximum measurement or the average measurement $((W_0-W_1)/2)$ of the side gaps $12c$ is larger than about 30 μm, the occurrence of cracks (delamination) is significantly reduced or prevented in a stable manner at the boundary between the inner layer portion $11m$ and the inner portion $12b_{21}$. In the case where the maximum measurement or the average measurement $((W_0-W_1)/2)$ of the side gaps $12c$ is about 90 μm or more, the electrostatic capacitance of the multilayer ceramic capacitor $10$ becomes too small, and it is not preferable. In other words, in the case where the maximum measurement or the average measurement $((W_0-W_1)/2)$ of the side gaps $12c$ is less than about 90 μm, the electrostatic capacitance of the multilayer ceramic capacitor $10$ is secured.

As described above, the thickness $T_1$ of the inner layer portion $11m$ in the stacking direction of the multilayer body $11$ is larger than the width measurement $W_1$ of the inner layer portion $11m$, in which the plurality of conductive layers $13$ are present in the widthwise direction W of the multilayer body $11$. Further, the thickness $T_1$ of the inner layer portion $11m$ in the stacking direction of the multilayer body $11$ preferably is larger than the width of the multilayer body $11$.

As will be described below, the boundary portion $12z$ of the outer portion $12b_{22}$ with the inner portion $12b_{21}$ improves the sticking force between the outer portion $12b_{22}$ and the inner portion $12b_{21}$. Thus, even if the adhesiveness among the first dielectric layers $12x$ present at the side gaps $12c$ decreases due to the thicker inner layer portion $11m$, the occurrence of cracks (delamination) is significantly reduced or prevented at the boundary between the outer portion $12b_{22}$ and the inner portion $12b_{21}$. Accordingly the contraction force due to the thermal contraction of the outer portion $12b_{22}$ is allowed to act on the inner portion $12b_{21}$. This makes it possible to alleviate the internal stress applied to the boundary between the inner layer portion $11m$ and the inner portion $12b_{21}$ due to the difference in thermal contraction ratio between the conductive layer and the dielectric layer at the time of firing, and significantly reduce or prevent the occurrence of cracks (delamination) at the boundary between the inner layer portion $11m$ and the inner portion $12b_{21}$.

As described above, each layer of the second dielectric layer $12y$ and the plurality of the first dielectric layers $12x$ includes barium titanate as the primary component. The adhesiveness between the inner portion $12b_{21}$ and the outer portion $12b_{22}$ preferably is improved by forming close chemical bonding at the boundary between the inner portion $12b_{21}$ and the outer portion $12b_{22}$. As a result, the occurrence of cracks (delamination) is significantly reduced or prevented at the boundary between the inner portion $12b_{21}$ and the outer portion $12b_{22}$.

As described above, the boundary portion $12z$ of the outer portion $12b_{22}$ with the inner portion $12b_{21}$ has a larger Si content than the middle portion $12m$ of the outer portion $12b_{22}$. Further, the top layer portion $12s$ of the outer portion $12b_{22}$ on the second principle surface $112$ side has a larger Si content compared to the middle portion $12m$ of the outer portion $12b_{22}$.

Now, a method is described for increasing Si content at each one of the boundary portion $12z$ and the top surface portion $12s$ of the outer portion $12b_{22}$, compared to the middle portion $12m$ of the outer portion $12b_{22}$. When the temperature and gaseous atmosphere at the time firing of the multilayer ceramic capacitor $10$ are set in such a way that Si segregates from grain boundaries of ceramic articles, the grain growth of ceramic particles progresses in the outer portion $12b_{22}$ that has a larger Si content, and Si segregates from grain boundaries of coarsened ceramic particles. Segregated Si moves along the grain boundaries of ceramic particles and accumulates at each one of the boundary portion $12z$ and the top surface portion $12s$ of the outer portion $12b_{22}$. As a result, the Si content at each one of the boundary portion $12z$ and the top surface portion $12s$ of the outer portion $12b_{22}$ becomes larger than that of the middle portion $12m$ of the outer portion $12b_{22}$.

In the case where the boundary portion $12z$ of the outer portion $12b_{22}$ with the inner portion $12b_{21}$ has a larger Si content than a middle portion $12m$ of the outer portion $12b_{22}$, the sticking force between the outer portion $12b_{22}$ and the inner portion $12b_{21}$ is improved. The reason may be that Si, which has moved along the grain boundaries of ceramic particles as described above, fills a minute void that is abundantly present in the boundary between the outer portion $12b_{22}$ and the inner portion $12b_{21}$, thus connecting the outer portion $12b_{22}$ and the inner portion $12b_{21}$ together. Thus, it is considered that the concentration of segregated Si at the boundary portion $12z$ is promoted or, conversely, the sticking force between the outer portion $12b_{22}$ and the inner portion $12b_{21}$ is improved by separately performing the formation of the inner portion $12b_{21}$ and the formation of the outer portion $12b_{22}$ and allowing the minute voids to be formed at the boundary between the inner portion $12b_{21}$ and the outer portion $12b_{22}$.

In the case where the top surface portion $12s$ of the outer portion $12b_{22}$ at the second principle surface $112$ side has a larger Si content amount than the middle portion $12m$ of the outer portion $12b_{22}$, a decline in mechanical strength of the multilayer body $11$ at the time of forming the outer electrode $14$ is significantly reduced or prevented. The reason is that the mechanical strength of the multilayer body $11$ decreases when a glass component contained in the outer electrode $14$ reacts with a ceramic dielectric material of the multilayer body $11$ at the time of forming the outer electrode $14$. In this case, the multilayer body $11$ is prone to crack that starts from an end portion of contact portion with the outer electrode $14$ on a center side of the multilayer body $11$ when the multilayer ceramic capacitor $10$ receives an external force during mounting or after the mounting. In the case where the outer portion $12b_{22}$ has a larger Si content amount, the reaction between the glass component contained in the outer electrode $14$ and the ceramic dielectric material of the multilayer body $11$ is significantly reduced or prevented. As a result, the decline in mechanical strength of the multilayer body $11$ at the time of forming the outer electrode $14$ is significantly reduced or prevented.

In the case where a rare earth compound is added to the primary component that is the perovskite type compound represented as $ABO_3$ at each one of the plurality of dielectric layers $12$, the molar ratio of the rare earth compound relative to Ti is preferably higher in the materials of each one of the partial set of the first dielectric layers $12x$ included in the inner layer portion $11m$ and the first dielectric layer $12x$ forming the inner portion $12b_{21}$, compared to that of the materials of the second dielectric layer $12y$ of the outer portion $12b_{22}$. In other words, the inner layer portion $11m$ and the inner portion $12b_{21}$ preferably contain a higher amount of the rare earth element than the outer portion $12b_{22}$.

As the rare earth element, Dy, Gd, Y, La or the like may be added to increase functionality of the multilayer ceramic capacitor $10$, for example. Specifically, the addition of the rare earth element stabilizes a capacitance temperature characteristic and prolongs a high temperature load life of insulating resistance in the multilayer ceramic capacitor $10$.

The rare earth element is, however, prone to concentrate at grain boundaries of ceramic particles or segregation layers, and has the property that it easily be eluted with water-soluble flux. Thus, in some cases, a ceramic component containing the rare earth element may be eluted with an organic acid such as adipic acid or the like, which is included in the water-soluble flux for use in soldering at the time of mounting the multilayer ceramic capacitor $10$. In such cases, cracking may occur at the outer layer of an embrittled multilayer body from which ceramic components are eluted.

Accordingly, the molar ratio of the rare earth element relative to Ti in the materials of each one of the partial set of the first dielectric layers $12x$ included in the inner layer portion $11m$ and the first dielectric layer $12x$ of the inner portion $12b_{21}$ is preferably about $0.003$ or more, and the molar ratio of the rare earth element relative to Ti in the materials of the second dielectric layer $12y$ of the outer portion $12b_{22}$ is preferably less than about $0.003$, for example.

In the case where the molar ratio of the rare earth element relative to Ti preferably is about $0.003$ or more in the materials of the first dielectric layer $12x$ included in the inner layer portion $11m$, the capacitance temperature characteristic is stabilized and the high temperature load life of insulating resistance is prolonged in the multilayer ceramic capacitor $10$.

In the case where the molar ratio of the rare earth element relative to Ti preferably is less than about $0.003$ in the materials of the second dielectric layer $12y$ of the outer portion $12b_{22}$, the occurrence of cracks at the outer portion $12b_{22}$, which is due to elution of ceramic components from the outer portion $12b_{22}$ and embrittlement of the outer portion $12b_{22}$, is significantly reduced or prevented. The foregoing features and their effects are confirmed by experiments performed with different Dy contents. Here, Dy is used as one example of the rare earth element. Similar effects are also confirmed in cases where Gd, Y, or La is used in place of Dy.

In the case where a Mn compound is added to the primary component that is the perovskite type compound represented as $ABO_3$ at each one of the plurality of dielectric layers $12$, the molar ratio of Mn relative to Ti is preferably higher in the materials of each one of the partial set of the first dielectric layers $12x$ included in the inner layer portion $11m$, the first dielectric layer $12x$ of the first outer layer portion $12b_1$, and the first dielectric layer $12x$ of the inner portion $12b_{21}$, compared to that of the materials of the second dielectric layer $12y$ of the outer portion $12b_{22}$. In other words, the inner layer portion 11m and the inner portion $12b_{21}$ preferably contain more Mn than the outer portion $12b_{22}$.

Color becomes brighter in the case where the dielectric layer has a smaller Mn content. Thus, in the case where each one of the inner layer portion 11m, the first outer layer portion $12b_1$, and the inner portion $12b_{21}$ contains more Mn than the outer portion $12b_{22}$, the color of the outer portion $12b_{22}$ becomes brighter compared to the color of each one of the inner layer portion 11m, the first outer layer portion $12b_1$, and the inner portion $12b_{21}$. This makes it possible to facilitate visual discrimination between the first principle surface 111 and the second principle surface 112 of the multilayer ceramic capacitor 10.

Thus, relative positions of the first principle surface 111 and the second principle surface 112 of the multilayer ceramic capacitor 10 may be identified by observing the multilayer ceramic capacitor 10 with an image capturing camera or the like. This makes it possible to align the position of the multilayer ceramic capacitor 10 automatically in such a way that the second principle surface 112 becomes a mounting surface at the time of mounting the multilayer ceramic capacitor 10.

For example, the molar ratio of Mn relative to Ti in the materials of each one of the partial set of the first dielectric layers 12x included in the inner layer portion 11m, the first dielectric layer 12x of the first outer layer portion $12b_1$, and the first dielectric layer 12x of the inner portion $12b_{21}$ is preferably about 0.0008 or more, and the molar ratio of Mn relative to Ti in the materials of the second dielectric layer 12y of the outer portion $12b_{22}$ is preferably less than about 0.0008, for example. The foregoing features and their effects are confirmed by experiments performed with different Mn contents.

Next, a component-mounted body in which the multilayer ceramic capacitor 10 according to the present preferred embodiment is mounted on a component-receiving body is described with reference to the drawings.

Figure 10:
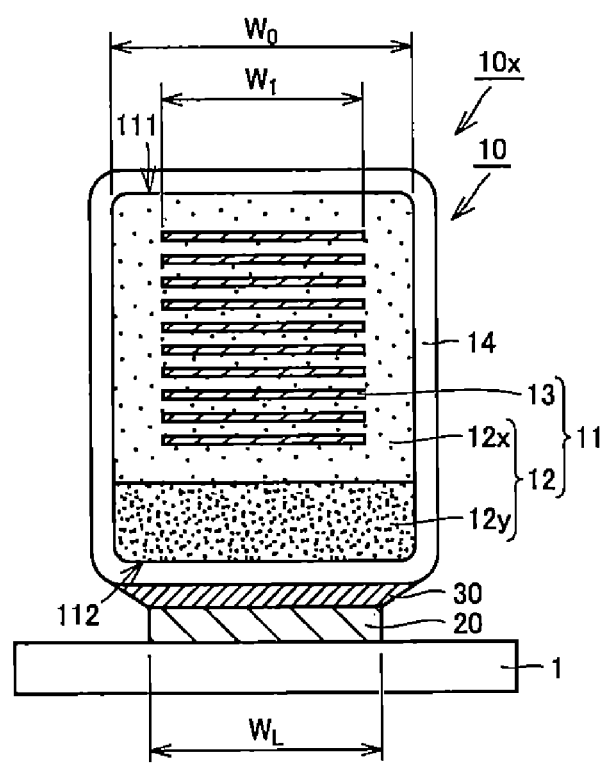
FIG. 10 is a cross sectional view illustrating a structure of a multilayer ceramic capacitor mounted body according to the preferred embodiment 1 of the present invention.

FIG. 10 is a cross sectional view illustrating a structure of a multilayer ceramic capacitor mounted body according to the preferred embodiment 1 of the present invention. As illustrated in FIG. 10, a multilayer ceramic capacitor mounted body 10x according to the preferred embodiment 1 of the present invention includes a multilayer ceramic capacitor 10 and a component-receiving body 1 on which the multilayer ceramic capacitor 10 is mounted, such as a circuit board or the like. The multilayer ceramic capacitor 10 is mounted on the component-receiving body 1 in such a way that the second principle surface 112 is disposed at the component-receiving body 1 side.

Specifically, the component-receiving body 1 includes a pair of lands 20 on its top surface, and the lands 20 are arranged at intervals. Each one of the pair of outer electrodes of the multilayer ceramic capacitor 10 is electrically connected to a corresponding one of the pair of lands 20 via solder 30 that defines and serves as a bonding agent. The bonding agent is not limited to solder, and may be any material capable of joining the pair of outer electrodes 14 and the pair of lands 20 mechanically and electrically.

A width measurement $W_L$ of each one of the pair of lands 20 is less than the width measurement $W_O$ of the multilayer body 11. The width measurement $W_L$ of each one of the pair of lands 20 is preferably less than the width measurement $W_1$ of the inner layer portion 11m.

In the case where the width measurement $W_L$ of each one of the pair of lands 20 is less than the width measurement $W_O$ of the multilayer body 11, each one of the pair of outer electrodes receives compressive stress from the solder 30 in the widthwise direction W of the multilayer body 11. The compressive stress applied to the pair of outer electrodes 14 also applies to the inner portion $12b_{21}$ via the outer portion $12b_{22}$. This makes it possible to alleviate internal stress applied to a boundary between the inner layer portion 11m and the second outer layer portion $12b_2$, and significantly reduce or prevent the occurrence of cracks (delamination) at the boundary between the inner layer portion 11m and the second outer layer portion $12b_2$.

In the case where the width measurement $W_L$ of each one of the pair of lands 20 is less than the width measurement $W_1$ of the inner layer portion 11m, the compressive stress to be applied to the inner portion $12b_{21}$ via the outer portion $12b_{22}$ increases, and the internal stress to be applied to the boundary between the inner layer portion 11m and the second outer layer portion $12b_2$ is further alleviated. This makes it possible to significantly reduce or prevent the occurrence of cracks (delamination) at the boundary between the inner layer portion 11m and the second outer layer portion $12b_2$.

Next, a multilayer ceramic capacitor array including a plurality of multilayer ceramic capacitors 10 according to the present preferred embodiment is described with reference to the drawings.

Figure 11:
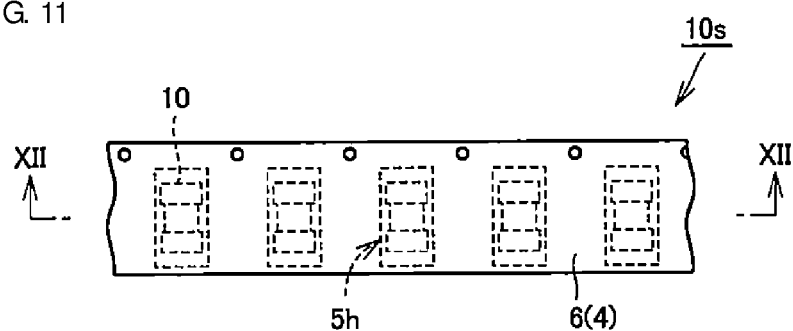
FIG. 11 is a plan view illustrating a structure of a multilayer ceramic capacitor array according to the preferred embodiment 1 of the present invention.
Figure 12:
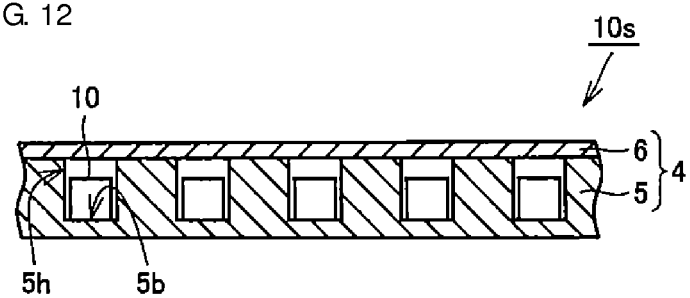
FIG. 12 is a cross sectional view of the multilayer ceramic capacitor array of FIG. 11 viewed from a line XII-XII arrow direction.

FIG. 11 is a plan view illustrating a structure of a multilayer ceramic capacitor array according to the preferred embodiment 1 of the present invention. FIG. 12 is a cross sectional view of the multilayer ceramic capacitor array of FIG. 11 viewed from a line XII-XII arrow direction.

As illustrated in FIGS. 11 and 12, a multilayer ceramic capacitor array 10s according to the preferred embodiment 1 of the present invention includes a plurality of multilayer ceramic capacitors 10, an elongated carrier tape 5 in which a plurality of depressed portions 5h are arranged at intervals to respectively store the plurality of multilayer ceramic capacitors 10, and a packaging body 4 including a cover tape 6 configured to cover the plurality of depressed portions 5h by attaching to the carrier tape 5. The plurality of multilayer ceramic capacitors 10 is stored inside respective ones of the plurality of depressed portions 5h in such a way that the second principle surface 112 is disposed on a bottom 5b side of each depressed portion 5h.

A plurality of multilayer ceramic capacitors 10 to be included in the multilayer ceramic capacitor array 10s is picked up from the packaging body 4 piece by piece and mounted on a component-receiving body 1. Specifically, in a state where the cover tape 6 is peeled off from the carrier tape 5, the multilayer ceramic capacitor 10 is picked up from the carrier tape 5 piece by piece by holding the multilayer ceramic capacitor 10 by suction at the first principle surface 111 side, and then mounted on the component-receiving body 1. As a result, the multilayer ceramic capacitor 10 is mounted on the component-receiving body 1 in such a way that the second principle surface 112 of the multilayer ceramic capacitor 10 is disposed at the component-receiving body 1 side.

In other words, the multilayer ceramic capacitor mounted body 10x according to the preferred embodiment 1 of the present invention may be easily fabricated by using the multilayer ceramic capacitor array 10s according to the preferred embodiment 1 of the present invention.

Next, a multilayer ceramic capacitor according to preferred embodiment 2 of the present invention is described. It should be noted that the multilayer ceramic capacitor according to the preferred embodiment 2 of the present invention differs from the multilayer ceramic capacitor according to the preferred embodiment 1 only in shape of a boundary portion between an outer portion and an inner portion of multilayer body. Thus, the description regarding the other elements will not be repeated.

Preferred Embodiment 2

The shape of a boundary portion between an outer portion and an inner portion of multilayer body of the multilayer ceramic capacitor according to the preferred embodiment 2 of the present invention is a shape rendered by a mother sheet group pressure-bonding method. Thus, first, the mother sheet group pressure-bonding method according to the present preferred embodiment is described.

Figure 13:
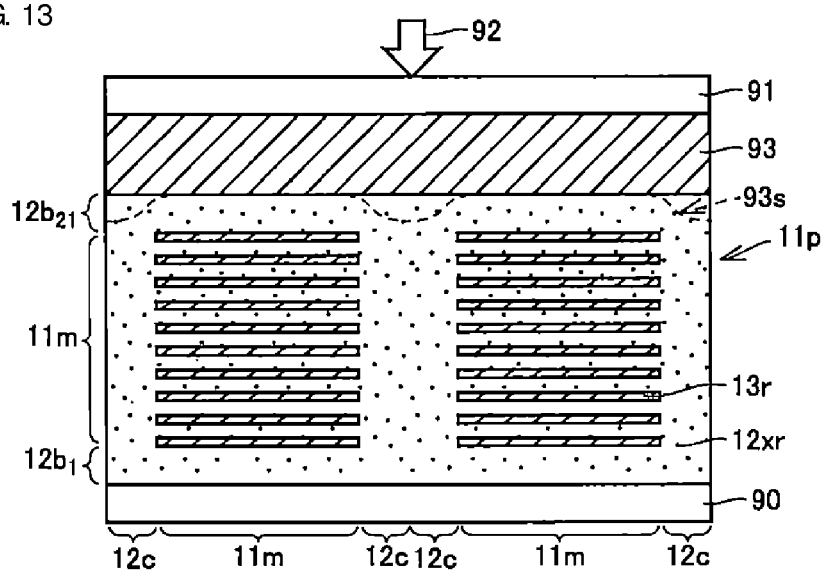
FIG. 13 is a cross sectional view illustrating a state where a mother sheet group of a multilayer ceramic capacitor according to preferred embodiment 2 of the present invention is being pressure-bonded.

FIG. 13 is a cross sectional view illustrating a state where mother sheet groups of the multilayer ceramic capacitors according to the preferred embodiment 2 of the present invention are being pressure-bonded. FIG. 13 illustrates the same cross sectional view as in FIG. 8. FIG. 13 illustrates only a portion that corresponds to two of partial multilayer bodies $11p$.

As illustrated in FIG. 13, in the present preferred embodiment, a plurality of mother sheets defining a first outer layer portion $12b_1$, a plurality of mother sheets defining an inner layer portion $11m$, and a plurality of mother sheets defining an inner portion $12b_{21}$ are stacked in this order to form mother sheet groups.

The mother sheet groups placed on a base 90 is being compressed and pressure-bonded by pressing a die plate 91 and a rubber 93 attached to a bottom surface of the die plate 91 from the side of the mother sheets forming the inner portion $12b_{21}$ along the stacking direction of the mother sheet group as denoted by an arrow 92.

In the mother sheet group, a stacking density at a location corresponding to the inner layer portion $11m$ is higher than a stacking density at a location corresponding to a side gap $12c$. Thus, the rubber 93 pressed down upon the mother sheet group convexly bulges out downward due to flow deformation toward the location corresponding to the side gap $12c$ from the location corresponding to the inner layer portion $11m$ as denoted by dotted lines $93s$ in FIG. 13. This allows the mother sheets to be pressure-bonded to each other at the location corresponding to the side gap $12c$ of the mother sheet group.

Figure 14:
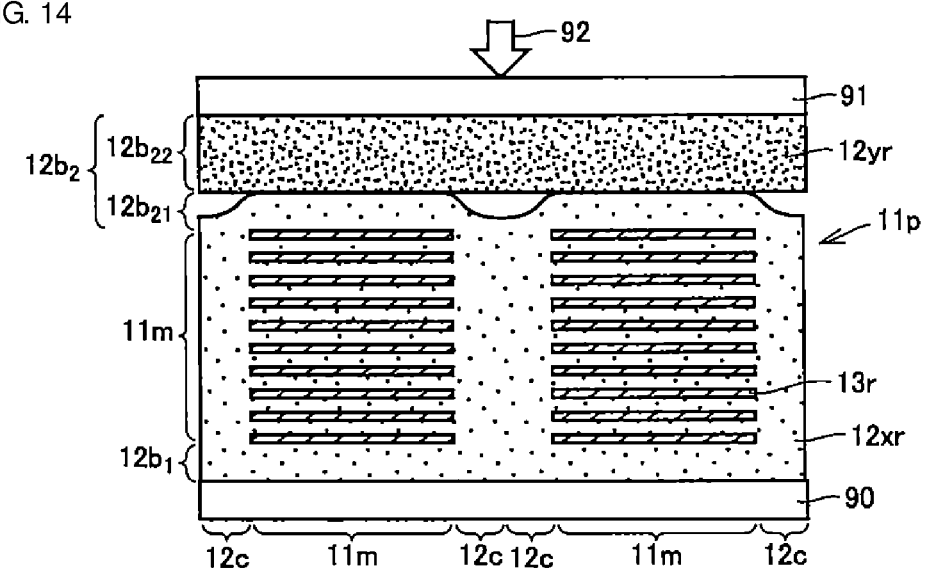
FIG. 14 is a cross sectional view illustrating a halfway state where a mother sheet group and a plurality of second ceramic green sheets are being pressure-bonded.

FIG. 14 is a cross sectional view illustrating a halfway state where the mother sheet group thus pressured-bonded and a plurality of second ceramic green sheets are being pressure-bonded. FIG. 14 illustrates only a portion that corresponds to two of soft multilayer bodies $11q$. As illustrated in FIG. 14, the mother sheet group that is pressure-bonded and the plurality of second ceramic green sheets are being compressed and pressure-bonded by pressing down the die plate 91 from the side of the mother sheets of the outer portion $12b_{22}$ along the stacking direction of the mother sheet group as denoted by the arrow 92. This completes the fabrication of a mother multilayer body.

Figure 15:
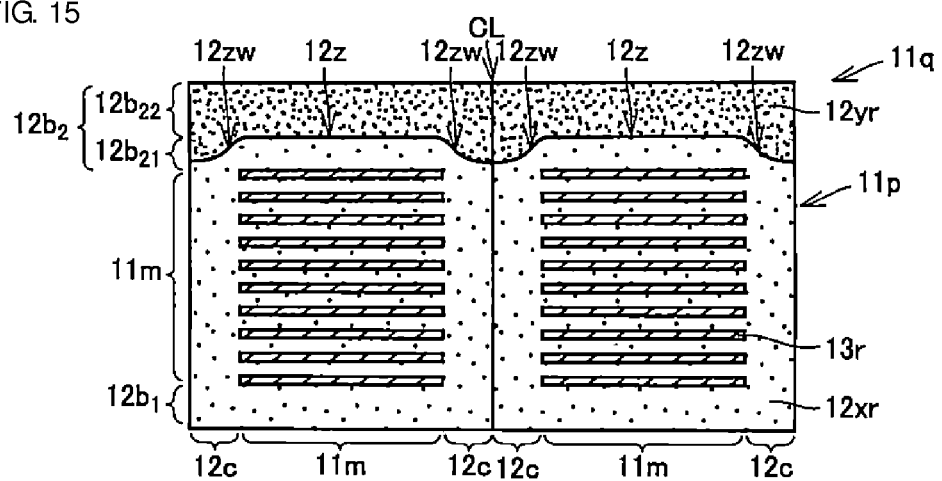
FIG. 15 is a cross sectional view illustrating a state where a mother multilayer body is cut.

FIG. 15 is a cross sectional view illustrating a state where the mother multilayer body is cut. FIG. 15 illustrates only a portion that corresponds to two of the soft multilayer bodies $11q$. As illustrated in FIG. 15, the plurality of second ceramic green sheets follows the shape of the top surface of the pressure-bonded mother sheet group, and convexly bulges out downward at the location corresponding to the side gap $12c$ due to flow deformation toward the location corresponding to the side gap $12c$ from the location corresponding to the inner layer portion $11m$.

Accordingly, a boundary portion $12z$ of the outer portion $12b_{22}$ with the inner portion $12b_{21}$ includes curved portions $12zw$ protruding downward at the locations corresponding to the side gaps $12c$ in the widthwise direction W of the multilayer body 11.

The mother multilayer body is cut at a cut line CL and separated to define a plurality of the soft multilayer bodies $11q$. Subsequent steps after the step described above are similar to those in the fabrication method of the multilayer ceramic capacitor 10 according to the preferred embodiment 1.

In the multilayer ceramic capacitor according to the present preferred embodiment, the adhesiveness among the first dielectric layers $12x$ present at the side gap $12c$ is improved. As a result, the occurrence of cracks (delamination) is significantly reduced or prevented at the first dielectric layers $12x$ present at the side gaps $12c$.

Further in the case where the boundary portion $12z$ of the outer portion $12b_{22}$ with the inner portion $12b_{21}$ includes the curved portions $12zw$ protruding downward at the locations corresponding to the side gaps $12c$ in the widthwise direction W of the multilayer body 11, the outer portion $12b_{22}$ holds the inner portion $12b_{21}$ between a pair of the curved portions $12zw$. This allows the contraction force of the outer portion $12b_{22}$ to apply effectively to the inner portion $12b_{21}$. As a result, the internal stress, which is applied to the boundary between the inner layer portion $11m$ and the second outer layer portion $12b_2$ due to the difference in thermal contraction ratio between the conductive layer and the dielectric layer at the time of firing, is alleviated. This makes it possible to further reduce or prevent the occurrence of cracks (delamination) at the boundary between the inner layer portion $11m$ and the second outer layer portion $12b_2$.

Next, exemplary non-limiting experiments are described. The exemplary non-limiting experiments evaluate effects of thickness and Si content amount at each one of the inner portion and the outer portion on reliability and crack occurrence at the time of firing of multilayer ceramic capacitor.

Exemplary Experiment 1

In the exemplary experiment 1, 21 types of multilayer ceramic capacitors, namely, comparison examples 1 to 11 and preferred embodiment examples 1 to 10 are prepared. First, conditions (design values) common for the 21 types of multilayer ceramic capacitors are described.

The thickness of the first outer layer portion is set to 40 μm, the thickness of the second outer layer portion is set to 100 μm, the thickness of the inner layer portion is set to 620 μm, the thickness of the conductive layer is set to 0.8 μm, the number of layers in the conductive layers is set to 330, and the molar ratio of Si relative to Ti in the materials of the first dielectric layer is set to 0.013.

For each one of the 21 types of multilayer ceramic capacitors including the comparison examples 1 to 11 and the preferred embodiment examples 1 to 10, the molar ratio of Si relative to Ti in the materials of the second dielectric layers of the outer portion, the thickness of the inner portion, and the thickness of the outer portion are set as in the following Table 1.

For the evaluation of crack occurrence at the time of firing of multilayer ceramic capacitor, ten pieces of multilayer ceramic capacitors are prepared for each one of the 21 types of multilayer ceramic capacitors. If any one of the ten pieces is found to have a crack occurrence, the multilayer ceramic capacitor type is evaluated as "bad", and if none of the ten pieces is found to have a crack occurrence, the multilayer ceramic capacitor type is evaluated as "good". Presence or absence of the occurrence of cracks is determined by grinding the individual piece to expose a WT cross section that goes through a center of multilayer body and by observing an exposed cross section with an optical microscope.

For the evaluation of reliability of multilayer ceramic capacitor, 20 pieces of multilayer ceramic capacitors are prepared for each one of the 21 types of multilayer ceramic capacitors. If any one of the 20 pieces is found to have IR value degradation, the multilayer ceramic capacitor type is evaluated as "bad", and if none of the 20 pieces is found to have the IR value degradation, the multilayer ceramic capacitor type is evaluated as "good".

The reliability of multilayer ceramic capacitor is evaluated by highly accelerated life test. Specifically, in an ambient temperature of 150 degrees C., a voltage of 8 V is applied to a multilayer ceramic capacitor, and the multilayer ceramic capacitor is determined to have the IR value degradation if an IR value of the multilayer ceramic capacitor reaches 10 kΩ or less within ten hours.

TABLE 1

| | MOLAR RATIO OF SI TO TI OF FIRST DIELECTRIC LAYER | MOLAR RATIO OF SI TO TI OF SECOND DIELECTRIC LAYER | DIFFERENCE IN MOLAR RATIO OF SI TO TI BETWEEN FIRST DIELECTRIC LAYER AND SECOND DIELECTRIC LAYER | THICKNESS OF INNER PORTION (μm) | THICKNESS OF OUTER PORTION (μm) | CRACK OCCURRENCE | RELIABILITY |
|---|---|---|---|---|---|---|---|
| PREFERRED EMBODIMENT EXAMPLE 1 | 0.013 | 0.017 | 0.004 | 10 | 90 | GOOD | GOOD |
| PREFERRED EMBODIMENT EXAMPLE 2 | 0.013 | 0.017 | 0.004 | 20 | 80 | GOOD | GOOD |
| PREFERRED EMBODIMENT EXAMPLE 3 | 0.013 | 0.017 | 0.004 | 30 | 70 | GOOD | GOOD |
| PREFERRED EMBODIMENT EXAMPLE 4 | 0.013 | 0.017 | 0.004 | 40 | 60 | GOOD | GOOD |
| PREFERRED EMBODIMENT EXAMPLE 5 | 0.013 | 0.017 | 0.004 | 50 | 50 | GOOD | GOOD |
| COMPARISON EXAMPLE 1 | 0.013 | 0.017 | 0.004 | 60 | 40 | BAD | GOOD |
| COMPARISON EXAMPLE 2 | 0.013 | 0.017 | 0.004 | 70 | 30 | BAD | GOOD |
| PREFERRED EMBODIMENT EXAMPLE 6 | 0.013 | 0.029 | 0.016 | 10 | 90 | GOOD | GOOD |
| PREFERRED EMBODIMENT EXAMPLE 7 | 0.013 | 0.029 | 0.016 | 20 | 80 | GOOD | GOOD |
| PREFERRED EMBODIMENT EXAMPLE 8 | 0.013 | 0.029 | 0.016 | 30 | 70 | GOOD | GOOD |
| PREFERRED EMBODIMENT EXAMPLE 9 | 0.013 | 0.029 | 0.016 | 40 | 60 | GOOD | GOOD |
| PREFERRED EMBODIMENT EXAMPLE 10 | 0.013 | 0.029 | 0.016 | 50 | 50 | GOOD | GOOD |
| COMPARISON EXAMPLE 3 | 0.013 | 0.029 | 0.016 | 60 | 40 | BAD | GOOD |
| COMPARISON EXAMPLE 4 | 0.013 | 0.029 | 0.016 | 70 | 30 | BAD | GOOD |
| COMPARISON EXAMPLE 5 | 0.013 | 0.033 | 0.020 | 10 | 90 | GOOD | BAD |
| COMPARISON EXAMPLE 6 | 0.013 | 0.033 | 0.020 | 20 | 80 | GOOD | GOOD |
| COMPARISON EXAMPLE 7 | 0.013 | 0.033 | 0.020 | 30 | 70 | GOOD | GOOD |
| COMPARISON EXAMPLE 8 | 0.013 | 0.033 | 0.020 | 40 | 60 | GOOD | GOOD |
| COMPARISON EXAMPLE 9 | 0.013 | 0.033 | 0.020 | 50 | 50 | GOOD | GOOD |
| COMPARISON EXAMPLE 10 | 0.013 | 0.033 | 0.020 | 60 | 40 | BAD | GOOD |
| COMPARISON EXAMPLE 11 | 0.013 | 0.033 | 0.020 | 70 | 30 | BAD | GOOD |

Table 1 summarizes evaluation results obtained by the exemplary experiment 1. As illustrated in Table 1, the occurrence of cracks at the time of firing of multilayer ceramic capacitor is significantly reduced or prevented in each one of the preferred embodiment examples 1 to 10 and the comparison examples 5 to 9, in which the thickness of the outer portion is equal to or larger than the thickness of the inner portion.

The multilayer ceramic capacitor of the comparison example 5 is found to be low in reliability. From this, it is discovered that the reliability of multilayer ceramic capacitor may decrease in the case where the molar ratio of Si relative to Ti in the materials of the second dielectric layer of the outer portion is larger than 0.029 and the thickness of the inner portion is less than 20 µm.

Next, exemplary non-limiting experiments are described that evaluate effects of the boundary portion of the outer portion with the inner portion having a higher Si content amount on the occurrence of cracks at the multilayer ceramic capacitor due to an external stress.

Exemplary Experiment 2

In the exemplary experiment 2, four types of multilayer ceramic capacitors, namely, comparison examples 12 to 13 and preferred embodiment examples 11 to 12 are prepared. First, conditions (design values) common for the four types of multilayer ceramic capacitors are described.

Here, the structure of the first outer layer portion is made similar to the structure of the second outer layer portion. The thickness of the first outer layer portion is set to 100 µm, the thickness of the second outer layer portion is set to 100 µm, that reaches the conductive layer, that type is evaluated as "bad", and if none of the ten pieces of multilayer ceramic capacitor mounted bodies is found to have a crack that reaches the conductive layer, that type is evaluated as "good".

Figure 16:
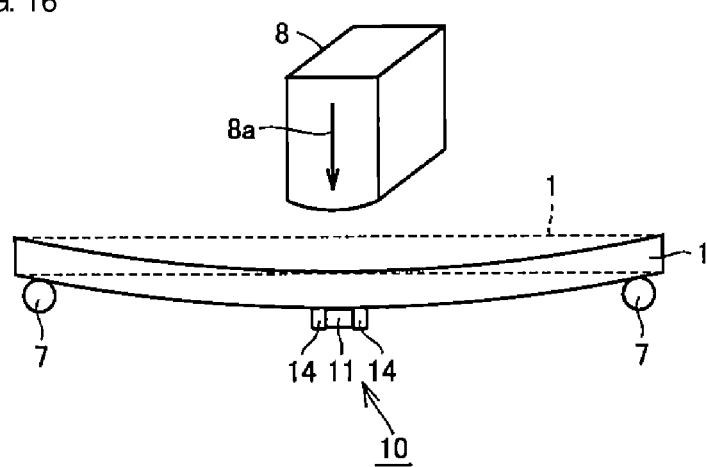
FIG. 16 is a schematic view illustrating a state where a substrate on which a multilayer ceramic capacitor is mounted is bent in exemplary experiment 2.

FIG. 16 is a schematic view illustrating a state where a substrate on which a multilayer ceramic capacitor is mounted is bended in the exemplary experiment 2. As illustrated in FIG. 16, the evaluation of crack occurrence due to an external stress in a multilayer ceramic capacitor is performed by checking whether a crack occurs or not at a multilayer ceramic capacitor 10 due to an external stress that applies to the multilayer ceramic capacitor 10 when a component-receiving body 1 on which the multilayer ceramic capacitor 10 is mounted is bent by a pressing jig 8.

Specifically, the multilayer ceramic capacitor 10 is mounted on a bottom surface of a component-receiving body 1, and the pressing jig 8 is pressed against the component-receiving body 1 at a right angle from a top surface side of the component-receiving body 1 as illustrated with an arrow 8a in FIG. 16 while supporting the component-receiving body 1 by a pair of support portions 7 at both end portions of the bottom surface of the component-receiving body 1. This causes the component-receiving body 1 to convexly curve downward. As a result, in the multilayer ceramic capacitor 10, a tensile stress is loaded on the multilayer body 11 via a pair of outer electrodes 14. Whether or not this tensile stress (external stress) causes a crack occurrence in the multilayer body 11 is checked. Presence or absence of the occurrence of cracks is determined by observing a cross section that is exposed by grinding the multilayer body with an optical microscope.

TABLE 2

| | MOLAR RATIO OF SI TO TI OF FIRST DIELECTRIC LAYER | MOLAR RATIO OF SI TO TI OF SECOND DIELECTRIC LAYER | THICKNESS OF INNER PORTION (µm) | THICKNESS OF OUTER PORTION (µm) | PRESENCE OR ABSENCE OF BOUNDARY | CRACK OCCURRENCE |
|---|---|---|---|---|---|---|
| PREFERRED EMBODIMENT EXAMPLE 11 | 0.013 | 0.017 | 50 | 50 | PRESENCE | GOOD |
| COMPARISON EXAMPLE 12 | 0.017 | 0.017 | 50 | 50 | ABSENCE | BAD |
| PREFERRED EMBODIMENT EXAMPLE 12 | 0.013 | 0.029 | 50 | 50 | PRESENCE | GOOD |
| COMPARISON EXAMPLE 13 | 0.029 | 0.029 | 50 | 50 | ABSENCE | BAD | the thickness of the inner layer portion is set to 620 µm, the thickness of the conductive layer is set to 0.8 µm, and the number of layers in the conductive layers is set to 330.

For each one of component-mounted bodies in which the four types of multilayer ceramic capacitors, namely, the comparison examples 12 to 13 and the preferred embodiment examples 11 to 12 are respectively mounted, the molar ratio of Si relative to Ti in the materials of the first dielectric layer, the molar ratio of Si relative to Ti in the materials of the second dielectric layer of the outer portion, the thickness of the inner portion, and the thickness of the outer portion are set as in the following Table 2.

For the evaluation of crack occurrence due to an external stress in a multilayer ceramic capacitor, ten pieces of multilayer ceramic capacitor mounted bodies are prepared for each one of the four types of multilayer ceramic capacitor mounted bodies. If any one of the ten pieces of multilayer ceramic capacitor mounted bodies is found to have a crack Table 2 summarizes evaluation results obtained by the exemplary experiment 2. As illustrated in Table 2, no crack that reaches the conductive layer is found in each one of the multilayer ceramic capacitor mounted bodies in the preferred embodiment examples 11 and 12 in which the boundary portion is present in the outer portion with the inner portion having a larger Si content amount. Even in the case where the occurrence of cracks is found at the outer portion, no crack extends into the inner portion. Thus, it is conceivable that the boundary portion in the outer portion with the inner portion having a larger Si content has a function to prevent a crack from reaching the conductive layer by stopping crack growth or deflect a direction of crack growth.

The present disclosure may be effectively applicable particularly to small size multilayer ceramic capacitors in which the thickness of the second outer layer portion $12b_2$ is about 50 µm or more, the electrostatic capacitance is about 10 µF or more, the lengthwise dimension of the multilayer body 11 is about 1.8 mm or less, and the number of stacked layers in the conductive layers 13 is about 300 or more.

In particular, of the small size multilayer ceramic capacitors, the present disclosure is more effectively applicable to multilayer ceramic capacitors in which the thickness $T_1$ of the inner layer portion 11m in the stacking direction of the multilayer body 11 is larger than the width measurement $W_1$ of the inner layer portion 11m in which a plurality of conductive layers 13 is present in the widthwise direction W of the multilayer body 11 and multilayer ceramic capacitors in which the thickness $T_1$ of the inner layer portion 11m in the stacking direction of the multilayer body 11 is larger than the width measurement $W_0$ of the multilayer body 11.

Next, a non-limiting example of a method for measuring thicknesses of a dielectric layer and a conductive layer of a multilayer ceramic capacitor is described. FIG. 17 is a view illustrating an example of a magnified image of a cross section of a multilayer ceramic capacitor observed with a scanning electron microscope. FIG. 17 illustrates a portion of the multilayer ceramic capacitor that is in contact with a potting compound 9 at the second principle surface 112 side.

When measuring the thicknesses of a dielectric layer and a conductive layer of a multilayer ceramic capacitor, first, as illustrated in FIG. 17, a line Lc extending in the stacking direction of a multilayer body and going through a center of the multilayer body is drawn on a magnified image of a cross section of the multilayer ceramic capacitor observed with a scanning electron microscope. Next, a plurality of lines parallel to the line Lc is drawn at even intervals (pitch S). The pitch S may be set to about five to ten times the thickness of a dielectric layer or a conductive layer to be measured. For example, in the case where a dielectric layer having a thickness of about 1 µm is to be measured, the pitch S may be set to about 5 µm. The same number of lines is drawn on both sides of the line Lc. In other words, in total, the odd number of lines is drawn including the line Lc. FIG. 17 illustrates five lines including a line La to a line Le.

Next, the thicknesses of the dielectric layers and the conductive layers are measured on each one of the line La to the line Le. In the case where, on each one of the line La to the line Le, a conductive layer is lost and dielectric layers adjacent to this lost conductive layer are connected, or the magnified image is unclear at a measurement location, the thickness or distance is measured on another line drawn at a location further separated from the line Lc.

For example, when measuring the thickness of dielectric layer 12, as illustrated in FIG. 17, a thickness $D_1$ on the line La, a thickness $D_2$ on the line Lb, a thickness $D_3$ on the line Lc, a thickness $D_4$ on the line Ld, and a thickness $D_5$ on the line Le are measured, and an average value of those measured thicknesses is obtained as the thickness of dielectric layer 12.

For example, when calculating an average thickness of the plurality of dielectric layers 12 in the inner layer portion 11m, the thickness according to the foregoing method is performed for each one of five dielectric layers 12 including a dielectric layer 12 disposed at substantially the center of the inner layer portion 11m in the thickness direction T and two pairs of dielectric layers 12 arranged at both sides thereof. An average value of measured results is obtained as the average thickness of the plurality of dielectric layers 12 in the inner layer portion 11m.

In the case where the plurality of dielectric layers 12 includes less than five layers, the thicknesses of all the dielectric layers 12 are measured by the foregoing method, and an average value of measured results is obtained as the average thickness of the plurality of dielectric layers 12.

In a method for measuring the length of the side gaps 12c, grinding is performed to expose the WT cross section that goes through a center of the multilayer body 11, and the cross section thus exposed is observed with an optical microscope to measure the length of a longest side gap 12c.

In a method for measuring the width measurement $W_1$ of the inner layer portion 11m, grinding is performed to expose the WT cross section that goes through a center of the multilayer body 11. Further, in the method, the cross section thus exposed is observed with an optical microscope to measure respective widths of a conductive layer 13 arranged closest to the first principle surface 111 side, a conductive layer 13 arranged closest to the second principle surface 112 side, and a conductive layer 13 arranged closest to the center of the inner layer portion 11m in the stacking direction. Finally, an average value of these three measurement values is calculated and obtained as the width measurement $W_1$.

In a method for measuring the thickness $T_1$ of the inner layer portion 11m, grinding is performed to expose the WT cross section that goes through a center of the multilayer body 11, and the cross section thus exposed is observed with an optical microscope to measure the length of a line segment that goes through the center of the multilayer body 11 and connects the conductive layer 13 arranged closest to the first principle surface 111 side and the conductive layer 13 arranged closest to the second principle surface 112 side with a minimum distance.

In a method for measuring the thickness of the first outer layer portion $12b_1$ or the second outer layer portion $12b_2$, grinding is performed to expose the WT cross section that goes through a center of the multilayer body 11, and the cross section thus exposed is observed with an optical microscope to measure the thickness of the first outer layer portion $12b_1$ or the second outer layer portion $12b_2$ at a center of the multilayer body 11 in the widthwise direction.

Composition analysis of materials of the first dielectric layer 12x or the second dielectric layer 12y may be performed by inductively coupled plasma (ICP) emission spectroscopic analysis or with a wavelength-dispersive X-ray spectrometer (WDX). In the case where the elemental analysis is performed by ICP emission spectroscopic analysis, an analysis sample is powdered and dissolved with an acid, and a solution thus obtained is analyzed by ICP emission spectroscopic analysis to determine the composition. In the case where the elemental analysis is performed with a WDX, a multilayer body buried with resin is grinded to expose the WT cross section, and the composition is determined using the WDX attached to a scanning electron microscope (SEM).

The boundary portion of the outer portion with the inner portion having a larger Si content may be identified by grinding the multilayer body buried with resin to expose a WT cross section and by capturing a backscattering electron image of the cross section thus exposed with a scanning electron microscope (SEM) for observation. Alternatively, element mapping of the exposed cross section may be produced by using a wavelength-dispersive X-ray spectrometer (WDX) attached to a scanning electron microscope (SEM), and the boundary portion may be identified by determining the portion where Si content is large.

It is to be understood that the preferred embodiments described in the present disclosure are exemplary in all aspects and are not restrictive. It is intended that the scope of the present invention is determined by the claims, not by the description described above, and includes all variations, which come within the meaning and range of equivalency of the claims.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer ceramic capacitor comprising:
a multilayer body including a plurality of dielectric layers and a plurality of conductive layers, which are stacked therein in a stacking direction, and including a first principle surface and a second principle surface that are opposite to each other in the stacking direction, a first end surface and a second end surface that are opposite to each other in a length direction and connect the first principle surface and the second principle surface, and a first side surface and a second side surface that are opposite to each other in a width direction and connect the first principle surface and the second principle surface as well as the first end surface and the second end surface; and
first and second outer electrodes provided on portions of a surface of the multilayer body and electrically connected to at least one of the plurality of conductive layers; wherein
the multilayer body includes a first outer layer portion which includes a first of the plurality of dielectric layers closest to the first principle surface, a second outer layer portion which includes a second of the plurality of dielectric layers closest to the second principle surface, and an inner layer portion adjacent to both of the first outer layer portion and the second outer layer portion, the inner layer portion including a portion extending from a first of the plurality of conductive layers closest to the first principle surface to a second of the plurality of conductive layers closest to the second principle surface in the stacking direction;
a dimension of the inner layer portion in the stacking direction is greater than a dimension of the inner layer portion in the width direction;
the second outer layer portion includes an outer portion including the second principle surface, and an inner portion disposed adjacent to both of the outer portion and the inner layer portion;
a dimension of the outer portion in the stacking direction is greater than a dimension of the inner portion; and
a composition ratio of Si relative to Ti in the outer portion is greater than that in the inner portion.

2. The multilayer ceramic capacitor according to claim 1, wherein the dimension of the inner layer portion in the stacking direction is greater than a dimension of the multilayer body in the width direction.

3. The multilayer ceramic capacitor according to claim 2, wherein a boundary region adjacent to the inner portion has a larger Si content compared to a central region of the outer portion in the stacking direction.

4. The multilayer ceramic capacitor according to claim 3, wherein
the first and second outer electrodes are disposed on portions of the second principle surface of the multilayer body; and
a surface region including the second principle surface in the outer portion has a larger Si content compared to that of a central region of the outer portion in the stacking direction.

5. The multilayer ceramic capacitor according to claim 1, wherein a composition ratio of a rare earth element relative to Ti of the dielectric layers in the inner layer portion is higher than that in the outer portion.

6. The multilayer ceramic capacitor according to claim 1, wherein a composition ratio of Dy relative to Ti of the dielectric layers in the inner layer portion is higher than that in the outer portion.

7. The multilayer ceramic capacitor according to claim 5, wherein each of a composition ratio of Mn relative to Ti of the dielectric layers in the inner layer portion, a composition ratio of Mn relative to Ti of the dielectric layers in the first outer layer portion, and a composition ratio of Mn relative to Ti of the dielectric layers in the inner portion, is higher than that in the outer portion.

8. The multilayer ceramic capacitor according to claim 4, wherein
the composition ratio of Si relative to Ti in the outer portion is about 0.004 higher than that in the inner portion;
the composition ratio of Si relative to Ti in the outer portion is not less than about 0.013 and not larger than about 0.03;
a composition ratio of a rare earth element composition relative to Ti in the dielectric layers of the inner layer portion is not less than about 0.003, and a composition ratio of a rare earth element relative to Ti in the outer portion is less than about 0.003;
each of a composition ratio of Mn relative to Ti in the dielectric layers of the inner layer portion, a composition ratio of Mn relative to Ti of the dielectric layers in the first outer layer portion, and a composition ratio of Mn relative to Ti of the dielectric layers in the inner portion is not less than about 0.0008; and
a composition ratio of Mn relative to Ti in the outer portion is not more than about 0.0008.

9. A multilayer ceramic capacitor series comprising:
a plurality of multilayer ceramic capacitors, each of the plurality of multilayer ceramic capacitors being the multilayer ceramic capacitor according to claim 1; and
a package including a carrier tape and a cover tape, the carrier tape including a plurality of cavities disposed apart from each other in which the plurality of multilayer ceramic capacitors are stored, the cover tape being attached to the carrier tape and covering the plurality of cavities; wherein
the second principle surfaces of the plurality of multilayer ceramic capacitors face bottoms of the plurality of respective cavities.

10. A multilayer ceramic capacitor mount body comprising:
the multilayer ceramic capacitor according to claim 1; and
a substrate on which the multilayer ceramic capacitor is mounted; wherein
the second principle surface of the multilayer ceramic capacitor faces the substrate.

* * * * *